(12) United States Patent
Suzuki et al.

(10) Patent No.: US 6,992,869 B2
(45) Date of Patent: Jan. 31, 2006

(54) MAGNETIC RESISTANCE DEVICE

(75) Inventors: Toshihisa Suzuki, Hamamatsu (JP); Naoshi Horiai, Hamamatsu (JP)

(73) Assignee: Yamaha Corporation, Shizuoka-Ken (JP)

( * ) Notice: Subject to any disclaimer, the term of this patent is extended or adjusted under 35 U.S.C. 154(b) by 186 days.

(21) Appl. No.: 09/777,325

(22) Filed: Feb. 6, 2001

(65) Prior Publication Data

US 2002/0145835 A1    Oct. 10, 2002

(51) Int. Cl.
*G11B 5/127*    (2006.01)

(52) U.S. Cl. .................................. 360/324.2

(58) Field of Classification Search .. 360/324.1–324.9, 360/314, 317, 321
See application file for complete search history.

(56) References Cited

U.S. PATENT DOCUMENTS

| | | | | |
|---|---|---|---|---|
| 6,333,842 B1 * | 12/2001 | Nobuyuki et al. | ....... | 360/324.2 |
| 6,469,879 B1 * | 10/2002 | Redon et al. | ............ | 360/324.2 |
| 6,482,657 B2 * | 11/2002 | Shimazawa | .................... | 438/3 |
| 6,563,682 B1 * | 5/2003 | Sugawara et al. | ....... | 360/324.2 |
| 6,567,244 B1 * | 5/2003 | Gill | ............................. | 360/314 |
| 6,583,967 B2 * | 6/2003 | Kasahara et al. | ........... | 360/321 |
| 6,639,766 B2 * | 10/2003 | Nobuyuki et al. | ....... | 360/324.2 |
| 6,710,986 B1 * | 3/2004 | Sato et al. | ............... | 360/324.2 |

FOREIGN PATENT DOCUMENTS

| | | |
|---|---|---|
| JP | 11-97762 | 4/1999 |
| JP | 11-112054 | 4/1999 |
| JP | 11-135857 | 5/1999 |

* cited by examiner

*Primary Examiner*—Allen Cao
(74) *Attorney, Agent, or Firm*—Dickstein, Shapiro, Morin & Oshinsky, LLP.

(57) ABSTRACT

In order to realize a magnetic resistance device having a high magnetic resistance change rate, satisfactory production yield and a low level of variation in production, a pair of magnetic tunnel resistance devices 2 employing a laminated structure comprised of antiferromagnetic film 8, lower magnetic layer 9, barrier film 10 and upper magnetic layer 11 are independently and separately formed by ion beam etching on a lower electrode 3 and in common with said lower electrode 3 provided on a substrate 5. A pair of independent upper electrodes 4 are formed on upper magnetic layer 11. As a result, a pair of magnetic tunnel resistance devices 2 are formed connected in series on substrate 5.

8 Claims, 17 Drawing Sheets

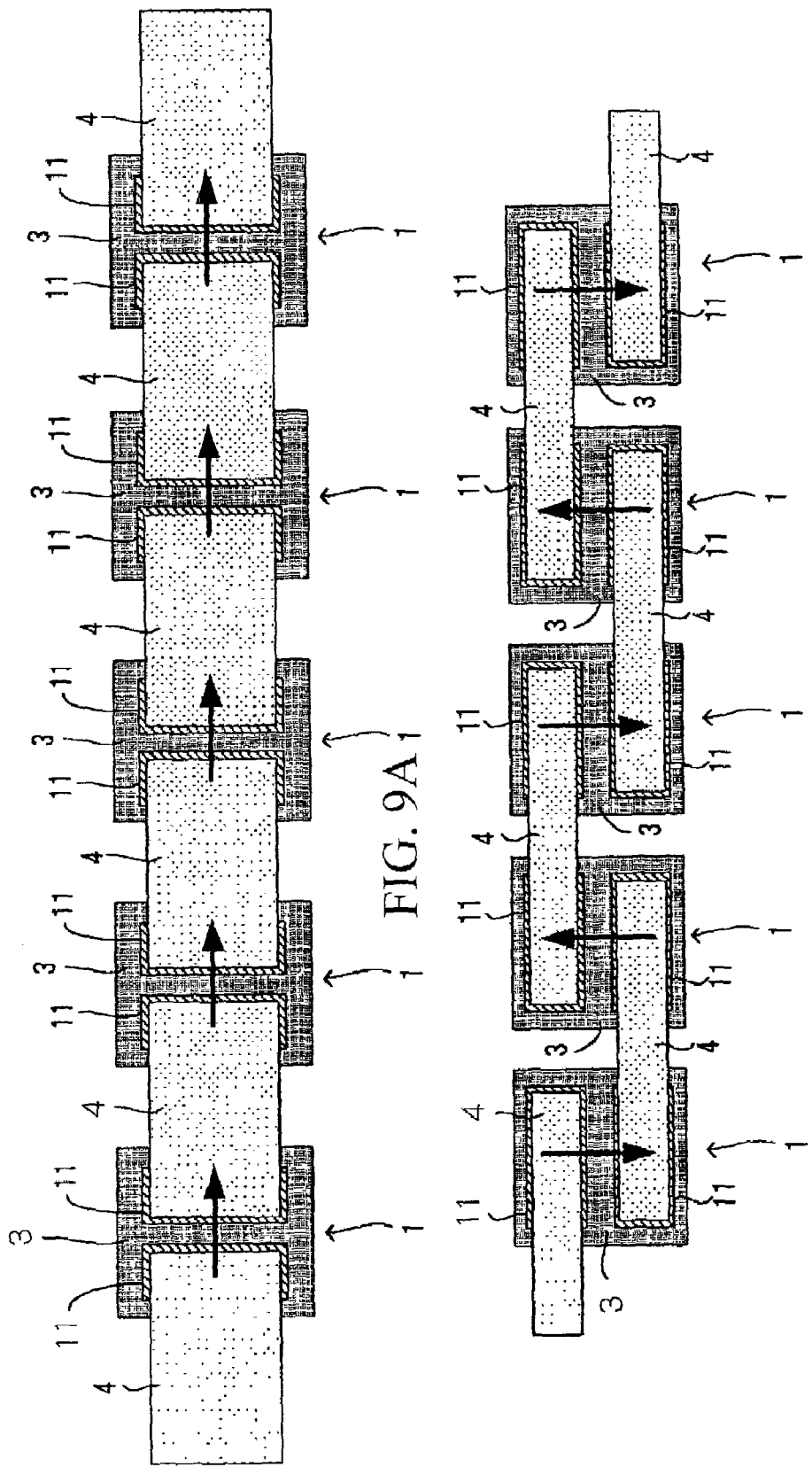

MAGNETIC RESISTANCE DEVICE

BACKGROUND OF THE INVENTION

1. Field of the Invention

The present invention relates to a magnetic resistance device used in magnetic heads and various types of sensors, and more particularly, to a magnetic resistance device in which a pair of magnetic tunnel junction structures, each composed of a barrier film sandwiched between a lower magnetic layer and an upper magnetic layer, formed connected in series on a substrate.

2. Description of Related Art

Magnetic resistance devices utilizing anisotropic magneto-resistance effects such as NiFe, and magnetic resistance devices that obtain giant magneto-resistance effects (GMR effects) utilizing the scattering of electrons that is dependent on their spin, are widely known in the prior art. Magnetic resistance change rate is one parameter used to evaluate the properties of this type of magnetic resistance device, and this magnetic resistance change rate exhibits a value of about 3% in the case of the former, and about 10% in the case of the latter.

Magnetic resistance devices have appeared in recent years that utilize magnetic tunnel effects to demonstrate large values for magnetic resistance change rate of 20–30%. As is indicated in, for example, Japanese Patent Application, First Publication (Kokai), No. Hei 11-135857, in addition to forming a magnetic tunnel junction structure, in which a barrier film comprised of an insulating material (e.g. $Al_2O_3$) is sandwiched between a lower magnetic layer comprised of a ferromagnetic material (e.g. $Ni_{0.81}Fe_{0.19}$ or CoFe) and an upper magnetic layer comprised of a ferromagnetic layer (e.g. $Ni_{0.81}Fe_{0.19}$), on a substrate, these magnetic resistance devices provide an antiferromagnetic layer (e.g. FeMn) directly beneath the lower magnetic layer, and use the lower magnetic layer as a stationary layer and the upper magnetic layer as a free layer to obtain a higher magnetic resistance change rate due to magnetic tunnel effects. In addition, even if an antiferromagnetic layer is not provided, magnetic tunnel effects similar to those described above are also known to be realized by providing a difference in coercive force between the upper magnetic layer and lower magnetic layer.

When using a magnetic resistance device using this magnetic tunnel effect, although a voltage is obtained corresponding to the magnetic resistance change rate relative to the change in the magnetic field by applying a constant current to the magnetic resistance device (magnetic tunnel junction), in the case of this magnetic resistance device, when the applied voltage is increased, the magnetic resistance change rate tends to decrease gradually. Together with this decrease, the decreasing trend in the magnetic resistance change rate becomes more remarkable the larger the resistance value. Thus, when a large voltage is applied to a magnetic resistance device, the problem is encountered in which it is not possible to obtain an adequate detection voltage corresponding to the change in the magnetic field since this large voltage causes a large decrease in the magnetic resistance change rate. Conversely, when a magnetic resistance device having a small resistance value is used, although the above-mentioned tendency for the magnetic resistance change rate to decrease is small, since the resistance of the magnetic resistance device itself is small, the same problem is encountered in which it is not possible to obtain a sufficiently large voltage.

In order to deal with these problems, as is indicated in, for example, Japanese Patent Application, First Publication (Kokai), No. Hei 11-97762, and Japanese Patent Application (Kokai), First Publication, No. Hei 11-112054, the use of a plurality of magnetic tunnel junction structures connected in series has been proposed. In this case, in the case of the former, a pair of barrier films and upper magnetic layers are independently and separately provided on a continuously formed lower magnetic layer so that use of the lower magnetic layer is shared. In addition, in the case of the latter, a plurality of basic units, each consisting of a tunnel junction structure in which separate pairs of barrier films and upper magnetic layers are formed on a common lower magnetic layer as described above, are arranged horizontally, and coupled with a continuous upper magnetic layer that is shared by adjacent basic units so as to connect a large number of tunnel junctions in series using common lower and upper magnetic layers.

In the case of forming a plurality of magnetic tunnel junction structures comprising a barrier film sandwiched between a lower magnetic layer and upper magnetic layer on a substrate and connecting in series as described above, fine machining processing is required, and wet etching is not suitable for the production of such elements. Thus, machining processing using dry etching in the form of ion beam etching is suitable for a laminate consisting of a lower magnetic layer, barrier film and upper magnetic layer on a substrate. However, since it is necessary to hold the surface roughness of the lower magnetic layer to a low level and it is not possible to compose a thick lower magnetic layer, it is difficult to reliably separate the barrier film while sharing a lower magnetic layer by ion beam etching. Namely, in the case of removing the barrier film by ion beam etching, although it is possible to control completion of etching treatment by measuring a prescribed time or detecting the material that composes the lower layer of the barrier film and so forth, if etching treatment is terminated too soon, the pair of barrier films cannot be reliably separated. As a result, this resulted in the problems of poor yield in the production of magnetic resistance devices and the occurrence of large variations in properties.

In addition, examples of major resistance elements in magnetic resistance devices using the magnetic tunnel effect as described above include electrodes and other wiring components as well as the barrier film and lower magnetic layer. Since only the barrier film of these resistance elements changes relative to changes in the magnetic field, in order to obtain a large magnetic resistance change rate, it is necessary to lower the resistance values of resistance elements other than the barrier film. In particular, if the lower magnetic layer located beneath barrier film is composed to be thick, the surface roughness of the same lower magnetic layer and so forth increases. Since this causes the formation of pin holes in barrier film, the lower magnetic layer and so forth cannot be excessively thick, and in the case current flowing between each magnetic tunnel junction structure flows through a common lower magnetic layer and so forth, the resistance element of this lower magnetic layer becomes a problem. However, in descriptions relating to the above-mentioned magnetic resistance devices of the prior art, only the connection of magnetic tunnel junction structures in series is presented, while no considerations whatsoever have been given to an optimum connection method, thereby preventing the obtaining of a high magnetic resistance change rate.

BRIEF SUMMARY OF THE INVENTION

In order to solve the above-mentioned problems, a first object of the present invention is to provide a magnetic resistance device formed by connecting in series on a substrate a pair of magnetic tunnel junction structures, composed of a barrier film sandwiched between a lower magnetic layer and an upper magnetic layer, that is able to maintain a satisfactory production yield and reduce variation.

A second object of the present invention is to provide a magnetic resistance device formed by connecting in series on a substrate magnetic tunnel junction structures, composed of a barrier film sandwiched between a lower magnetic layer and an upper magnetic layer, that allows the obtaining of a high magnetic resistance change rate.

A first constitution of the present invention for achieving the above-mentioned first object is characterized by independently forming a pair of magnetic tunnel junction structures, composed of a barrier film sandwiched between a lower magnetic layer and an upper magnetic layer, on respective conductive layers provided consecutively on a substrate, and independently forming upper electrodes on each upper magnetic layer of the above-mentioned pair of magnetic tunnel junction structures.

In this case, a stationary magnetizing layer (antiferromagnetic layer or ferromagnetic layer) for making each lower magnetic layer a stationary layer should be independently and separately provided between the above-mentioned conductive layer and each lower magnetic layer of the above pair of magnetic tunnel junction structures, or said stationary magnetizing layer should be provided continuously shared by each. In addition, the above-mentioned stationary magnetizing layer may be independently and separately provided between each upper magnetic layer of the above pair of magnetic tunnel junction structures and each of the above independent upper electrodes. In this type of magnetic resistance device, the above pair of magnetic tunnel junction structures should be formed by ion beam etching on the above conductive layer.

In this manner, according to the first constitution of the present invention, since a pair of magnetic tunnel junction structures is independently separated to each lower magnetic layer, if a pair of magnetic tunnel junction structures is formed separately by ion beam etching treatment as described above, completion of ion beam etching treatment can be made to respond to detection of the material of the layer immediately beneath the lower magnetic layer, making it possible to reliably separate each barrier film in the pair of magnetic tunnel junction structures. Thus, according to the present invention, in addition to eliminating poor yield during production, magnetic resistance devices having nearly identical properties can be mass produced easily.

A second constitution of the present invention for achieving the above second object is characterized by a magnetic resistance device comprising connecting a pair of magnetic tunnel junction structures, composed of a barrier film sandwiched between a lower magnetic layer and an upper magnetic layer, in series on a substrate, wherein together with respectively forming the shape of each of the above magnetic tunnel junction structures when viewed in a plan view as a rectangle comprised of long sides and short sides, each of the long sides of each of said magnetic tunnel junction structures is arranged to be in parallel and in opposition.

In this case, each of the lower magnetic layers of the above pair of magnetic tunnel junction structures should be electrically connected on the above substrate.

In addition, as a specific example of the arrangement of the above plurality of magnetic tunnel junction structures, a third constitution of the present invention is characterized by a magnetic resistance device provided with a plurality of magnetic tunnel junction structures linearly on a substrate and connecting them in series, wherein together with respectively forming the shape of each of the above magnetic tunnel junction structures when viewed in a plan view as a rectangle, the long sides of said rectangle are made to be perpendicular to the direction in which the above plurality of magnetic tunnel junction structures are arranged.

In this case, the above plurality of magnetic tunnel junction structures should be connected in series by alternately and electrically connecting, in each adjacent pair of magnetic tunnel junction structures, the upper magnetic layer of a magnetic tunnel junction structure to the lower magnetic layer of the next magnetic tunnel junction structure in succession. Alternatively, the above plurality of magnetic tunnel junction structures may also be connected in series by successively and electrically connecting the lower magnetic layer of each magnetic tunnel junction structure to the upper magnetic layer of the adjacent magnetic tunnel junction structure along a single direction.

In addition, as a specific example of a different mode of the arrangement of the above plurality of magnetic tunnel junction structures, a fourth constitution of the present invention is characterized by respectively forming the shape of each of the above magnetic tunnel junction structures when viewed in a plan view as a rectangle comprised of long and short sides, making each long side of each pair of magnetic tunnel junction structures in parallel and mutually opposing, and arranging said plurality of magnetic tunnel junction structures linearly in the direction of each long side and in two rows in the direction of each short side.

In this case, said plurality of magnetic tunnel junction structures are connected in series by respectively electrically connecting each lower magnetic layer of each pair of magnetic tunnel junction structures in which said long sides are mutually opposing, and electrically connecting every other upper magnetic layer of each adjacent magnetic tunnel junction structure for every row.

According to the constitutional characteristics of the second to fourth constitutions of the present invention composed in the manner described above, since the current that flows between each of the magnetic tunnel junction structures is in a direction perpendicular to the lengthwise direction of the rectangle of each magnetic tunnel junction structure, namely passing through a plane having a large surface area, the resistance between each magnetic tunnel junction structure can be reduced. In particular, even if a lower magnetic layer, stationary magnetizing layer (antiferromagnetic layer or ferromagnetic layer), conductive layer and other layers located beneath the barrier film cannot be made to be thick as a result of forming the magnetic resistance device using ion beam etching treatment and so forth, since current flows in the direction in which the cross-sectional area of the lower magnetic layer and other layers is large, the resistance between each magnetic tunnel junction structure can be reduced. Thus, according to the present invention, resistance values of resistance elements other than the barrier film can be held to a low level, and the magnetic resistance change rate of the magnetic resistance device can be maintained at a large value.

In addition, a fifth constitution of the present invention is characterized by a magnetic resistance device comprising a plurality of magnetic tunnel junction structures, composed of a barrier film sandwiched between a lower magnetic layer and an upper magnetic layer, arranged on a substrate, wherein together with the above plurality of magnetic tunnel junction structures being arranged vertically and horizontally in groups of a plurality of structures each in the form of a matrix, said plurality of magnetic tunnel junction structures are connected in series.

In this case, together with linearly, successively and electrically connecting the above plurality of magnetic tunnel junction structures in the vertical or horizontal direction of the above matrix, said plurality of magnetic tunnel junction structures are connected in series by electrically connecting so as to turn around at both ends of said matrix.

According to the fifth constitution of the present invention, since a large number of magnetic tunnel junction structures can be connected in series, and a large voltage can be applied overall even though the voltage applied to a single magnetic tunnel junction device is small, a large voltage can be obtained while holding down the reduction in the magnetic resistance change rate as much as possible, enabling an adequate detection voltage to be obtained corresponding to changes in the magnetic field. In addition, since a plurality of magnetic tunnel junction structures are arranged in the form of a matrix, a magnetic resistance device can be formed in the shape of a square of appropriate length without being excessively wide or long, thereby being advantageous in terms of production and strength.

In the magnetic resistance device of the above fifth constitution, together with respectively forming each of the shapes of the above plurality of magnetic tunnel junction structures when viewed in a plan view as a rectangle, the shape of a matrix composed of said plurality of magnetic tunnel junction structures may be formed when viewed in a plan view as a rectangle, and the direction of the long sides of the rectangle of each of the above magnetic tunnel junction structures may be aligned with the long sides of the rectangle of the above matrix.

In a magnetic resistance device composed in this manner, since the width perpendicular to the direction of the magnetic field of the magnetic resistance device can be shortened, the degree of the effect of a demagnetizing field can be held to a low level. Thus, in addition to effects resulting from having arranged a large number of magnetic tunnel junction structures in the form of the above matrix, a large magnetic resistance change rate can be secured without being subjected to the effects of demagnetizing fields.

Furthermore, in the above description, a rectangle may be nearly a rectangular shape, and even if it has somewhat rounded corners, it is still referred to as a rectangle in the present specification.

BRIEF DESCRIPTION OF THE SEVERAL VIEWS OF THE DRAWING

FIG. 9A is a schematic overhead view showing a second connection example in which the above plurality of magnetic resistance devices are connected linearly in series. FIG. 9B is a schematic overhead view showing a third connection example in which the above plurality of magnetic resistance devices are connected linearly in series.

DETAILED DESCRIPTION OF THE INVENTION

Although the following provides an explanation of the magnetic resistance device as in the embodiments of the present invention, an explanation is first provided regarding an example of the basic constitution having only a pair of magnetic tunnel junction structures.

a. Example of Basic Constitution

Figure 1:
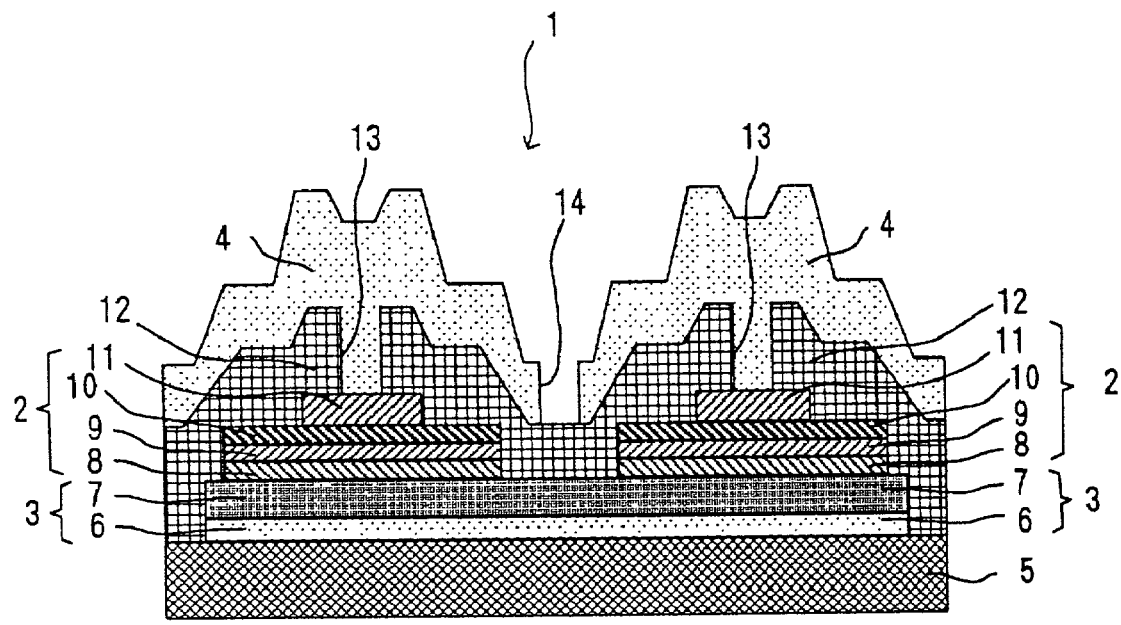
FIG. 1 is a cross-sectional view of a magnetic resistance device showing an example of the basic constitution as in a first embodiment of the present invention.

FIG. 1 shows a cross-sectional view of an example of the basic constitution of magnetic resistance device 1. This magnetic resistance device 1 has lower electrode 3, composed of first conductive film 6 made of, for example, Ti having a film thickness of 15 nm, and, second conductive film 7 made of, for example, Cu having a film thickness of 300 nm, formed on substrate 5 made of, for example, $SiO_2/Si$, glass or quartz. Two antiferromagnetic films 8, made of, for example, RhMn having a film thickness of 50 nm, are separately formed on lower electrode 3. Each lower magnetic layer 9 made of, for example, Co having a film thickness of 30 nm, is respectively formed on each antiferromagnetic film 8, and each barrier film 10, formed by oxidation treatment of, for example, an Al film having a film thickness of 1.8 nm, is respectively provided on each lower magnetic layer 9. Each upper magnetic layer 11 made of, for example, NiFe having a film thickness of 65 nm, is respectively provided on each barrier film 10.

Magnetic tunnel resistance devices 2 are respectively formed by these antiferromagnetic films 8, lower magnetic layers 9, barrier films 10 and upper magnetic layers 11. Namely, magnetic tunnel resistance devices 2 are respectively provided between each of two upper electrodes 4 and lower electrode 3. Antiferromagnetic films 8 are fixed in the direction of magnetization of lower magnetic layers 9 so that magnetization of lower magnetic layers 9 is not reversed within the range over which magnetization of upper magnetic layers 11 is reversed (namely, antiferromagnetic films 8 are used as stationary magnetizing layers with respect to lower magnetic layers 9). In this case, in addition to lower magnetic layers 9 functioning as stationary layers, upper magnetic layers 11 function as free layers. In the present invention, the free layer is defined as a magnetic layer of which a magnetization rotates under the influence of an external magnetic field. In contrast, the pinned layer is defined as a magnetic layer of which a direction of magnetization does not rotate under the influence of the external magnetic field.

Furthermore, in the present specification, a structure in which the above barrier film 10 is sandwiched between lower magnetic layer (stationary layer) 9 and upper magnetic layer (free layer) 11 is referred to as a magnetic tunnel junction structure. In addition, the shape of upper magnetic layers 11 (magnetic tunnel resistance device 2) when viewed in a plan view is in the form of a rectangle, the long sides of which measure 8 μm while the short sides measure 2 μm. Namely, the aspect ratio (ratio of the long sides to the short sides of the free layer) of this magnetic tunnel resistance device 2 is set to "4".

Interlayer insulating film 12 made of, for example, $SiO_2$ having a film thickness of 1000 nm is formed at the region covering substrate 5, lower electrode 3 and magnetic tunnel resistance devices 2. Contact holes 13 are respectively formed in this interlayer insulating film 12 over magnetic tunnel resistance devices 2. Upper electrodes 4 made of, for example, Cu having a film thickness of 300 nm are respectively formed so as to bury these contact holes 13. In this manner, a magnetic resistance device 1 is formed in which two magnetic tunnel resistance devices 2 are connected in series on said lower electrode 3 (first and second conductive films 6 and 7) by sharing said lower electrode 3 (first and second conductive films 6 and 7).

Next, an explanation is provided of the production method of magnetic resistance device 1 as in this example of the basic constitution using the flow charts of FIGS. 2 and 3.

(1) Step 1

To begin with, a pre-cleaned substrate 5 made of, for example, $SiO_2/Si$, glass or quartz, is placed in a sputtering apparatus. The chamber of this sputtering apparatus is evacuated to $1\times10^{-7}$ Torr or lower. Argon gas having a purity of, for example, 99.9999% is introduced into the chamber until the pressure reaches 4 mTorr. Direct current power of, for example, 200 W is applied to a sputter gun installed inside the chamber, and using, for example, Ti and Cu targets having a target size diameter of 126 mm, a Ti film having a film thickness of 15 nm is deposited on substrate 5 in the form of first conductive film 6 at a deposition rate of, for example, 12 nm/minute. A Cu film having a film thickness of 300 nm is then deposited on this first conductive film 6 in the form of second conductive film 7 at a deposition rate of, for example, 25 nm/minute.

(2) Step 2

Figure 2A:
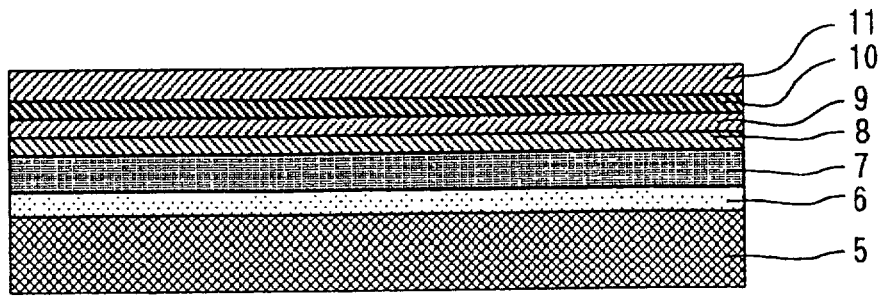
FIGS. 2A through 2D are cross-sectional views showing the production method of a magnetic resistance device as in the above example of the basic constitution in the order of the production sequence.

Next, as shown in FIG. 2A, in an argon gas atmosphere at, for example, 4 mTorr, direct current power of 100 W is applied to a sputter gun having a target size diameter of 126 mm, and an RhMn film having a film thickness of 50 nm is deposited on the second conductive film 7 in the form of antiferromagnetic film 8 at a deposition rate of 6.5 nm/minute. A direct current power of 100 W is then applied to a sputter gun having a target size diameter of 126 mm to deposit a Co film having a film thickness of 30 nm on this antiferromagnetic film 8 in the form of lower magnetic layer 9 at a deposition rate of 6 nm/minute.

(3) Step 3

Next, as shown in FIG. 2A, for example, a direct current power of 20 W is applied to a sputter gun having a target size diameter of 126 mm to deposit an Al film having a film thickness of 1.8 nm on lower magnetic layer 9 using Al at a deposition rate of 2 nm/minute. After depositing the Al film, substrate 5 is transferred to a treatment chamber without breaking the vacuum, pure oxygen is introduced until the pressure in the chamber reaches 100 Torr, and oxidation treatment of the Al film is performed by, for example, allowing to stand for 20 minutes. As a result, barrier film 10 is obtained composed of aluminum oxide $Al_2O_3$.

(4) Step 4

Next, as shown in FIG. 2A, for example, direct current power of 100 W is applied to a sputter gun having a target size diameter of 126 mm to deposit an NiFe film having a film thickness of 65 nm on barrier film 10 in the form of upper magnetic layer 11 at, for example, a deposition rate of 6.5 nm/minute.

(5) Step 5

Figure 2B:
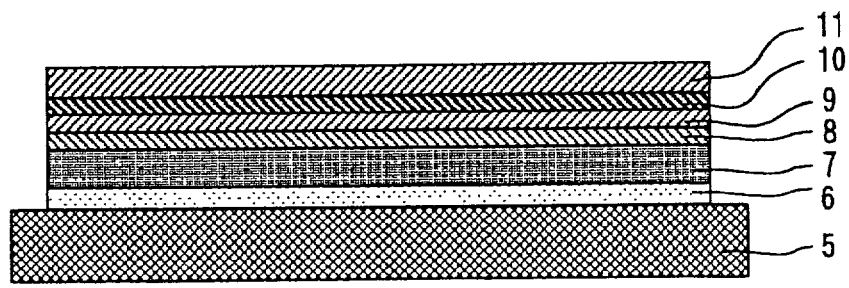

Next, after patterning the upper surface of upper magnetic layer 11 with a resist film, the outer edges of upper magnetic layer 11, barrier film 10, lower magnetic layer 9, antiferromagnetic film 8, second conductive film 7 and first conductive film 6 are removed by ion beam etching using an ion milling apparatus to form a laminated structure consisting of upper magnetic layer 11, barrier film 10, lower magnetic layer 9, antiferromagnetic film 8, second conductive film 7 and first conductive film 6, from which the edges have been removed, as shown in FIG. 2B. In this case, in the above etching, for example, the applied power is 500 V and 400 mA, the gas pressure is 0.2 mTorr, and the etching rate is 70 nm/minute. This etching is conditioned on detection of the material (such as $SiO_2/Si$) of substrate 5 dug up by said etching, and is completed after the passage of a certain amount of time after this detection, followed by removal of the resist film with acetone.

(6) Step 6

Figure 2C:
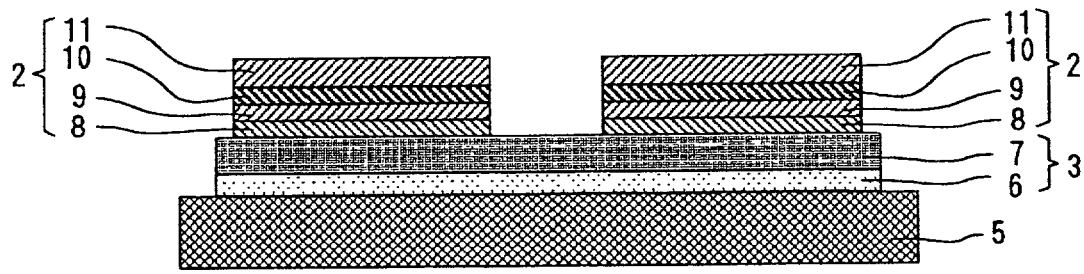

Next, after patterning the upper surface of upper magnetic layer 11 with a resist film, the central portion in the lateral direction shown in the drawing and both edges of upper magnetic layer 11, barrier film 10, lower magnetic layer 9 and antiferromagnetic film 8 are removed by ion beam etching using an ion milling apparatus to respectively form a pair of laminated structures respectively composed of upper magnetic layer 11, barrier film 10, lower magnetic layer 9 and antiferromagnetic film 8 on second conductive film 7 as shown in FIG. 2C. The conditions of the above etching and removal of the resist film are the same as those of the above step 5. Furthermore, in this case, etching is conditioned on the detection of the material (Cu) of second conductive film 7 dug up by said etching, and is completed at the time of said detection or after the passage of a certain amount of time after said detection.

(7) Step 7

Figure 2D:
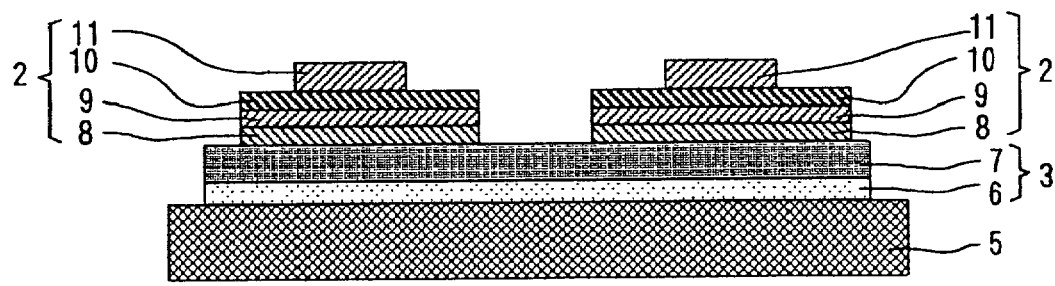

Next, after patterning the upper surface of the pair of upper magnetic layers 11 with a resist film, the outer edges of each upper magnetic layer 11 are removed by ion beam etching using an ion milling apparatus to leave upper magnetic layers 11 only in the center of each upper surface of each barrier film 10 as shown in FIG. 2D. In this etching, the applied power is 500 V and 400 mA, the gas pressure is 0.2 mTorr, the etching rate is 20 nm/minute, and the beam angle is 0 degrees. In addition, completion of etching is conditioned on the detection of the material ($Al_2O_3$) of barrier film 10 dug up by said etching, and is completed at the time of said detection or after the passage of a certain amount of time after said detection.

Following the above etching, in order to remove the so-called side wall deposits resulting from the processed article having become adhered to the side walls, only the beam angle of the above etching conditions is changed to 60 degrees to remove the deposits. The resist is then removed with acetone following completion of etching. As a result, a pair of magnetic tunnel resistance devices 2 are formed on second conductive film 7 respectively composed of antiferromagnetic film 8, lower magnetic layer 9, barrier film 10 and upper magnetic layer 11. The size of each of these magnetic tunnel resistance devices (size of upper magnetic layer 11 which is the free layer) is such that the short sides measure 2 $\mu$m while the long sides measure 8 $\mu$m. Namely, the aspect ratio of each magnetic tunnel resistance devices 2 is "4".

(8) Step 8

Figure 3A:
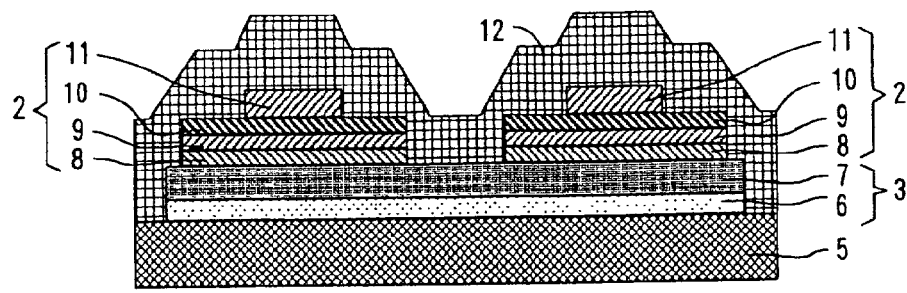
FIGS. 3A through 3D are cross-sectional views of a magnetic resistance device showing the next step of FIG. 2 in the order of the production sequence.

Next, the resulting product following completion of step 7 is placed inside a vacuum chamber of the sputtering apparatus. After then, for example, evacuating the inside of the vacuum chamber to $2.0 \times 10^{-6}$ Torr or lower and introducing argon gas at 5 mTorr, the top of substrate 5 is covered with interlayer insulating film 12 as shown in FIG. 3A. In this case, for example, power of 900 W having a frequency of 13.56 MHz is applied to an SiO2 target having a diameter of 126 mm to form interlayer insulating film 12 comprised of $SiO_2$ and having a film thickness of 1000 nm at a deposition rate of 13 nm/minute.

(9) Step 9

Figure 3B:
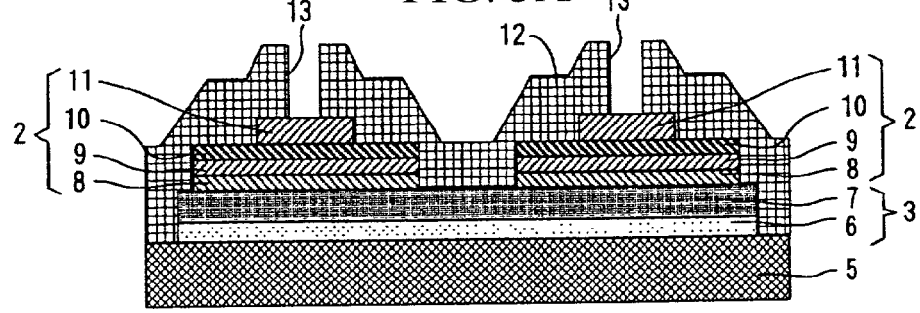

Next, after patterning the upper surface of the deposited interlayer insulating film 12 with a resist film, interlayer insulating film 12 above each upper magnetic layer 11 is removed by ion beam etching using an ion milling apparatus to form contact holes 13 in interlayer insulating film 12 as shown in FIG. 3B. In this etching, for example, the applied power is 500 V and 400 mA, gas pressure is 0.2 mTorr, etching rate is 30 nm/minute and the beam angle is 0 degrees. This etching is conditioned on detection of the material (NiFe) of upper magnetic layer 11 dug up by said etching, and is completed after the passage of a certain amount of time after this detection, followed by removal of the resist film using, for example, acetone.

(10) Step 10

Figure 3C:
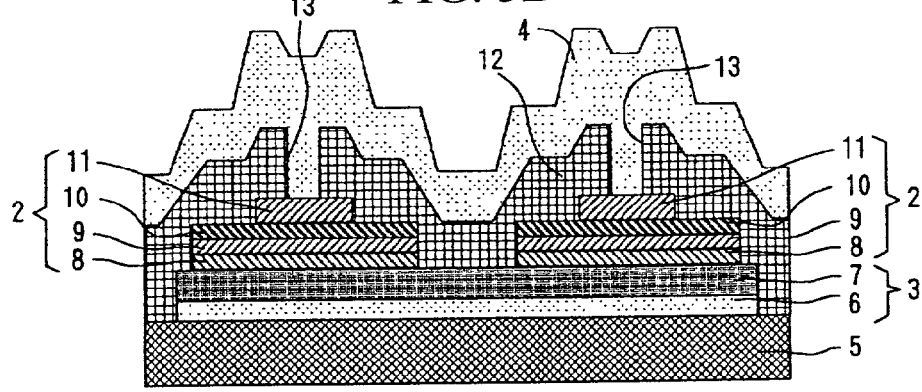

Next, the product on which formation of contact holes 13 has been completed is placed in a vacuum chamber, and after evacuating the inside of the vacuum chamber to $2.0 \times 10^{-6}$ Torr or lower, argon gas is introduced at, for example, 5 mTorr. As shown in FIG. 3C, for example, power of 200 W having a frequency of 13.56 MHz is applied to a Cu target having a diameter of 126 mm to form upper electrode 4 comprised of Cu and having a film thickness of 300 nm at a deposition rate of 30 nm/minute.

(11) Step 11

Figure 3D:
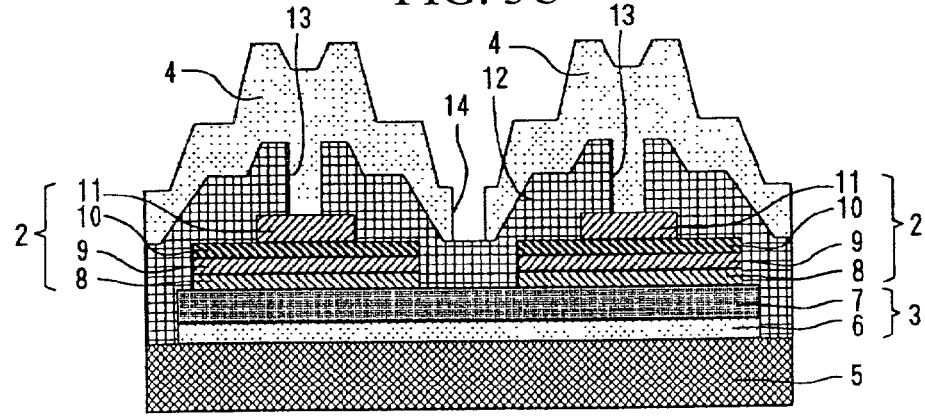

Next, after patterning the upper surface of the deposited upper electrode 4 with a resist film, the center of upper electrode 4 (notch 14) is removed by ion beam etching using an ion milling apparatus to separate upper electrode 4 into two sections as shown in FIG. 3D. In this etching, the applied power is 500 V and 400 mA, gas pressure 0.2 mTorr, and the etching rate is 70 nm/minute. This etching is conditioned on detection of the material ($SiO_2$) of interlayer insulating film 12 dug out by said etching, and is completed after the passage of a certain amount of time after this detection, followed by removal of the resist film using, for example, acetone following completion of said etching. As a result, magnetic resistance device 1 using magnetic tunnel effects shown in FIG. 1 is formed.

In this manner, in the ion beam etching of the above steps 5–7, 9 and 11, since ion beam etching stops as a result of detecting the material component of the layer beneath an unnecessary portion, a portion of the upper surface of said layer positioned beneath is also removed in order to reliably remove said unnecessary portion.

In the example of the basic constitution composed in the manner described above, if a voltage is applied between the pair of upper electrodes 4, current flows through one of the magnetic tunnel resistance devices 2, first and second conductive films 6 and 7, and the other magnetic tunnel resistance device 2. At this time, if the external magnetic field is changed, the resistance value of the pair of magnetic tunnel resistance devices 2 connected in series changes allowing the change in the external magnetic field to be detected. In magnetic resistance device 1 in which this pair of magnetic tunnel resistance devices 2 are connected in series, even if the voltage applied between upper electrodes 4 is increased to a certain degree, since the voltage applied to one magnetic tunnel resistance device 2 is not that large, a relatively large voltage change can be obtained while maintaining a large magnetic resistance change rate.

In addition, according to the example of the basic constitution described above, since magnetic resistance device 1 is formed using ion beam etching treatment, minute treatment can be performed. In order to separate the pair of magnetic tunnel resistance devices 2, upper magnetic layer 11, barrier film 10, lower magnetic layer 9 and antiferromagnetic layer 8 are removed by ion beam etching, while the above ion beam etching is terminated by detection of the material of second conductive film 7. Consequently, upper magnetic layers 11, barrier films 10, lower magnetic layers 9 and antiferromagnetic layers 8 can be reliably isolated and separated. As a result, according to the above example of the basic constitution, in addition to eliminating worsening of the production yield, magnetic resistance devices 1 having nearly identical properties can be easily mass-produced.

b. Variations of the Example of the Basic Constitution

Figure 4:
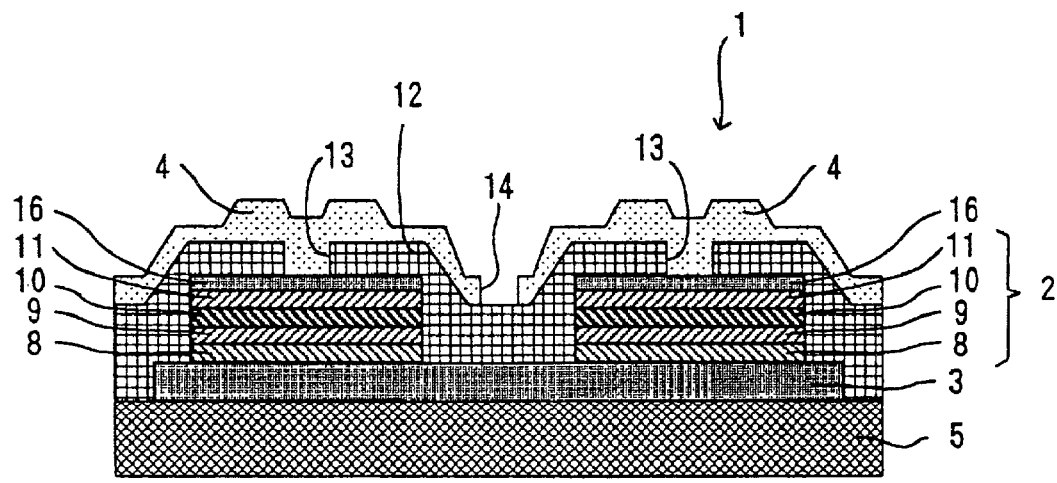
FIG. 4 is a cross-sectional view of a magnetic resistance device showing a first variation of the above example of the basic constitution.

Next, a first variation of the above example of the basic constitution is explained using FIG. 4. In this first variation, lower electrode 3 is provided in which a first conductive film made of Cr (or Ti) and having a film thickness of about 10 nm is formed on substrate 5. A pair of magnetic tunnel resistance devices 2 are provided on lower electrode 3 while sharing lower electrode 3. These magnetic tunnel resistance devices 2 each have laminated structures composed of antiferromagnetic films (stationary mobilizing layers) 8, lower magnetic layers 9, barrier films 10 and upper magnetic layers 11 having the same shape (rectangle measuring 10×60 $\mu$m and an aspect ratio of "6") when viewed in a plan view. Antiferromagnetic films (stationary magnetizing layers) 8 are made of RhMn having a film thickness of about 30 nm. Lower magnetic layers 9 are made of NiFe having a film thickness of about 10 nm. Barrier films 10 are made of $Al_2O_3$ having a film thickness of about 2 nm. Upper magnetic layers 11 are composed of a bi-layer structure comprised of a Co film having a film thickness of about 2 nm for the lower layer, and an NiFe film having a film thickness of about 20 nm for the upper layer. In order to provide a margin by etching of each magnetic tunnel resistance device 2, dummy film 16 made of an Mo film, having a film thickness of about 60 nm and having the same shape when viewed in a plan view as each of said upper magnetic layers 11 is formed over each upper magnetic layer 11. Interlayer insulating film 12 is formed with $SiO_2$ to a film thickness of about 250 nm, and upper electrode 4 is formed with Al to a film thickness of about 300 nm.

In the production of magnetic resistance device 1 as in the first variation composed in this manner, lower electrode 3, antiferromagnetic film 8, lower magnetic layer 9, barrier film 10, upper magnetic layer 11 (comprised of a Co film and NiFe film) and dummy film 16 are laminated to the above thickness on substrate 5 using the same type of method as steps 1 through 4 of the previously described example of the basic constitution. Next, the outer edge of this laminated structure consisting of lower electrode 3, antiferromagnetic film 8, lower magnetic layer 9, barrier film 10, upper magnetic layer 11 (comprised of a Co film and NiFe film) and dummy film 16 on substrate 5 are removed by ion beam etching using an ion milling apparatus in the same manner as step 5 of the above example of the basic constitution. Next, the central portion in the lateral direction shown in the drawing and both edges of dummy layer 16, upper magnetic layer 11, barrier film 10, lower magnetic layer 9 and antiferromagnetic film 8 are removed by ion beam etching in the same manner as step 6 of the above example of the basic constitution to independently form a pair of separate laminated structures consisting of antiferromagnetic films 8, lower magnetic layers 9, barrier films 10, upper magnetic layers 11 and dummy films 16 on lower electrode 3. Interlayer insulating film 12 and upper electrodes 4 are then formed in the same manner as steps 8 through 11 of the above example of the basic constitution.

In this manner, in this first variation as well, magnetic resistance device 1 is formed using ion beam etching in which a pair of magnetic tunnel junction structures, respectively comprised of lower magnetic layers 9, barrier films 10 and upper magnetic layers 11, are independently connected in series on common lower electrode 3 through a pair of independent antiferromagnetic layers 8. In the forming of this pair of magnetic tunnel junction structures as well, since the portion extending from dummy film 16 to upper magnetic layer 11, barrier film 10, lower magnetic layer 9 and antiferromagnetic film 8 is removed by ion beam etching, and said ion beam etching is terminated by detection of the material of lower electrode 3, the portion extending to dummy films 16, upper magnetic layers 11, barrier films 10, lower magnetic layers 9 and antiferromagnetic layers 8 can be reliably separated. As a result, in this first variation as well, in addition to eliminating worsening of the production yield, magnetic resistance devices 1 having nearly identical properties can be easily mass-produced.

Figure 5:
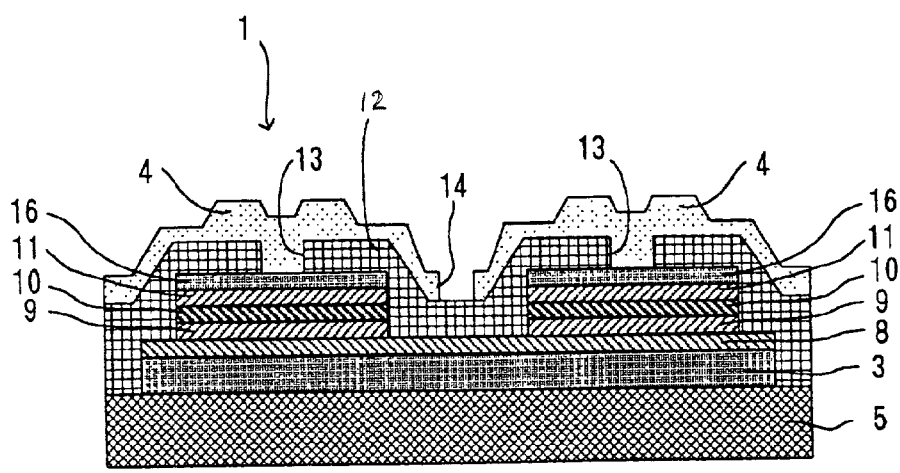
FIG. 5 is a cross-sectional view of a magnetic resistance device showing a second variation of the above example of the basic constitution.

In addition, the previously mentioned example of the basic constitution can also be altered in the manner of the following second through fifth variations. As shown in FIG. 5, a magnetic resistance device 1 as in a second variation provides a pair of magnetic tunnel junction structures, respectively composed of lower magnetic layers 9, barrier films 10 and upper magnetic layers 11, separately and connected in series on antiferromagnetic film 8 by continuously arranging lower electrode 3 and antiferromagnetic film 8 so as to be shared by them. In the forming of this pair of magnetic tunnel junction structures as well, since the portion from dummy layer 16 to upper magnetic layer 11, barrier film 10 and lower magnetic layer 9 is removed by ion beam etching using an ion milling apparatus, and said ion beam etching is terminated by detection of the material of antiferromagnetic film 8, the portion extending to dummy films 16, upper magnetic layers 11, barrier films 10 and lower magnetic layers 9 can be reliably separated. In addition, even if antiferromagnetic layer 8 is somewhat excessively removed, since lower electrode 3 is provided continuously in common with it, there are no changes in the properties of magnetic tunnel resistance device 2. As a result, in this second variation as well, in addition to eliminating worsening of the production yield, magnetic resistance devices 1 having nearly identical properties can be easily mass-produced.

Figure 6:
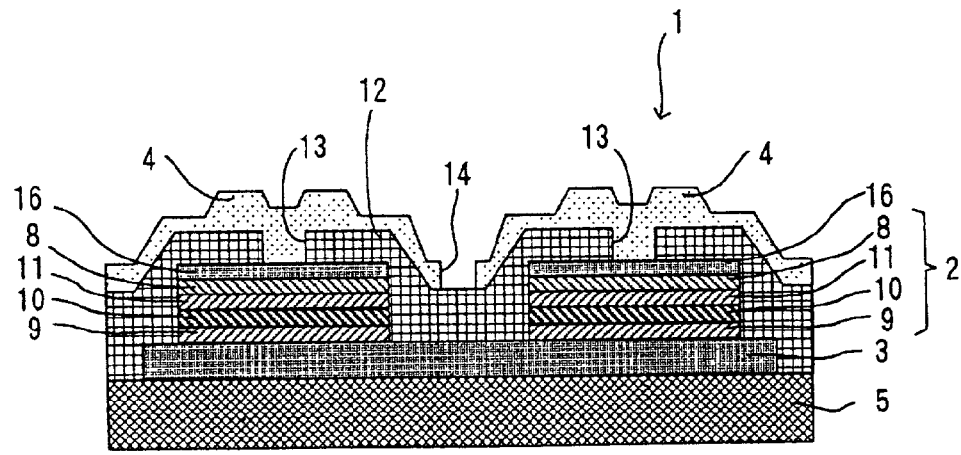
FIG. 6 is a cross-sectional view of a magnetic resistance device showing a third variation of the above example of the basic constitution.

As shown in FIG. 6, magnetic resistance device 1 as in a third variation is such that the antiferromagnetic film 8 of the above first variation is respectively separated between a pair of magnetic tunnel resistance devices 2 so as to be provided between each upper magnetic layer 11 and each dummy film 16. Accordingly, together with upper magnetic layers 11 functioning as stationary layers, lower magnetic layers 9 function as free layers. In addition, in the production of this magnetic resistance device 1 as in this third variation, together with changing the order of lamination using the same materials as the above second variation at the same film thicknesses, lower magnetic layers 9, barrier films 10, upper magnetic layers 11, antiferromagnetic films 8 and dummy films 16 should be respectively formed separately and independently on a common lower electrode 3 by ion beam etching using an ion milling apparatus.

Figure 7:
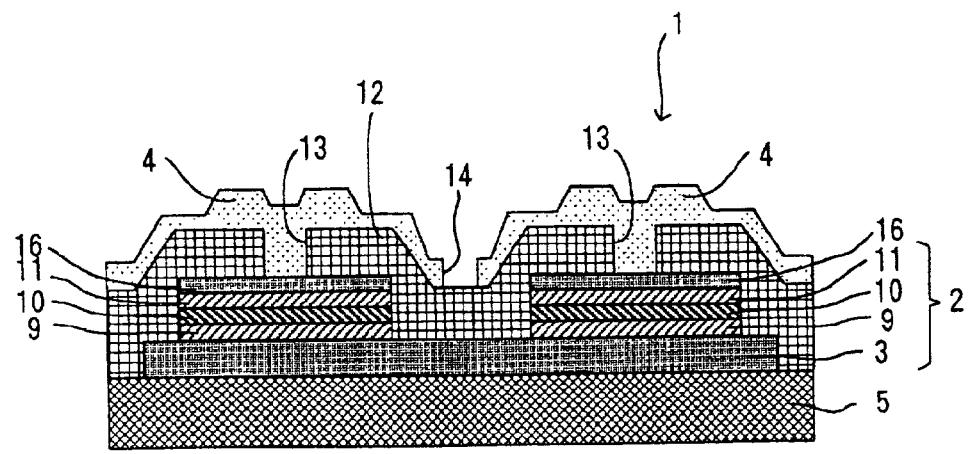
FIG. 7 is a cross-sectional view of a magnetic resistance device showing a fourth variation of the above example of the basic constitution.

As shown in FIG. 7, a magnetic resistance device 1 as in a fourth variation removes the antiferromagnetic film 8 of the above first through third variations so that a pair of magnetic tunnel resistance devices 2 are only composed of lower magnetic layers 9, barrier films 10 and upper magnetic layers 11. In this case, as a result of providing a somewhat large difference in coercive force between each lower magnetic layer 9 and each upper magnetic layer 11, together with allowing that having the smaller coercive force to function as a free layer, that having the larger coercive force is allowed to function as a stationary layer. In addition, in the production of this magnetic resistance device 1 as in this fourth variation, together with laminating using the same materials as the above first variation at the same film thicknesses while excluding antiferromagnetic film 8, lower magnetic layers 9, barrier films 10, upper magnetic layers 11 and dummy films 16 should be respectively formed separately and independently on a common lower electrode 3 by ion beam etching using an ion milling apparatus.

In these third and fourth variations as well, since a pair of magnetic tunnel junction structures comprising lower magnetic layers 9, barrier films 10 and upper magnetic layers 11 are composed by independently connecting in series on a common lower electrode 3 using ion beam etching treatment, similar effects can be expected as in the above first and second variations.

Furthermore, in the above first and second variations, together with using antiferromagnetic film 8 as a stationary magnetizing layer in order to use lower magnetic layer 9 as a stationary layer, in the above third variation, antiferromagnetic film 8 comprised of RhMn is used as a stationary magnetizing layer in order to use upper magnetic layer 11 as a stationary layer. However, an antiferromagnetic film 8 comprised of FeMn or PtMn and so forth may be used instead of one comprised of RhMn.

In addition, a ferromagnetic film comprised of CoPtCr and so forth having a film thickness of about 30 nm can respectively be used as a stationary magnetizing layer in order to use lower magnetic layer 9 or upper magnetic layer 11 as a stationary layer. As a result of using a ferromagnetic film comprised of CoPtCr, in addition to the effects obtained by the above first through fourth variations, favorable temperature characteristics are also obtained. In addition, a ferromagnetic film having sufficiently large coercive force such as that comprised of CoTaCr can also be used in place of that comprised of the above CoPtCr.

In addition, in the above example of the basic constitution and each of its variations, although an Al film is oxidized by allowing to stand for 20 minutes in a pure oxygen chamber according to the treatment of the above step 3 in order to form barrier film 10, in this case, the final normalized resistance value per one magnetic tunnel resistance device 2 is about 20 k$\Omega \cdot \mu m^2$. In order to increase this normalized resistance value, the thickness of the above Al film may be increased and the above oxidation treatment time may be lengthened. As a result, the above normalized resistance value can be increased to roughly 200 k$\Omega \cdot \mu m^2$. In addition, the above normalized resistance value can also be increased to 1 M $\Omega \cdot \mu m^2$ by introducing oxygen into the vacuum chamber following deposition at 100 mTorr, generating oxygen plasma by applying a high frequency of, for example, 13.56 MHz, and exposing the Al film to the oxygen plasma for, for example, 1 minute.

In addition, although the production method of barrier film 10 used a method using pure oxygen in the present embodiment, there are no particular restrictions on the production method by the present invention, and the present invention can also use a method such as natural oxidation or oxidation by irradiating the Al film with an oxygen ion beam in place of oxygen plasma.

In this manner, although the normalized resistance value of magnetic tunnel resistance device 2 is adjusted in various ways, when this normalized resistance value increases, since the effects of thermal noise increase, it is necessary to restrict the normalized resistance value to a certain value depending on the application.

In addition, although Cu, Ti, Cr and so forth are used as the materials of lower electrode 3 in the above example of the basic constitution and each of its variations, the material of lower electrode 3 is not limited to these, while conducting, non-magnetic metal materials such as W, Ta, Au or Mo can also be used. In addition, each of the conducting, non-magnetic metal materials like those described above can also be used for upper electrode 4 and dummy film 16.

Moreover, in the example of the basic constitution and each variation composed in the manner described above, if the film thickness between barrier film 10 and substrate 5, including lower electrode 3 of the non-magnetic layer that connects two magnetic tunnel resistance devices 2 or lower magnetic layer 9 on this lower electrode 3, exceeds 100 nm, surface roughness increases that causes the formation of pin holes in barrier film 10. Thus, it is necessary that the film thickness not exceed 100 nm. In addition, the film thickness between barrier film 10 and substrate 5 should preferably be 50 nm or less.

c. Series Connection Examples

Next, an explanation is provided of connection examples in which a plurality of magnetic resistance devices 1 as in the above-mentioned example of the basic constitution and each of its variations are connected in series in order maintain a high magnetic resistance change ratio while also obtaining a large output voltage.

First Connection Example

Figure 8A:
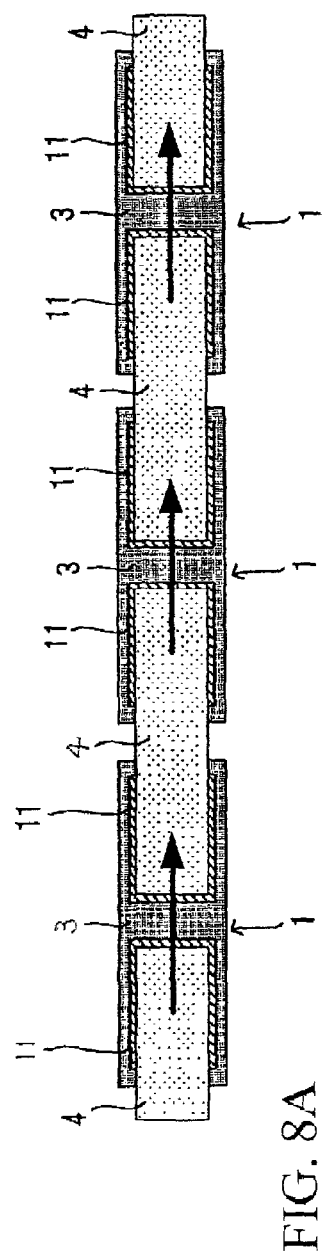
FIG. 8A is a schematic overhead view showing a first connection example in which a plurality of magnetic resistance devices as in a first variation of the above example of the basic constitution are connected linearly in series.
Figure 8B:
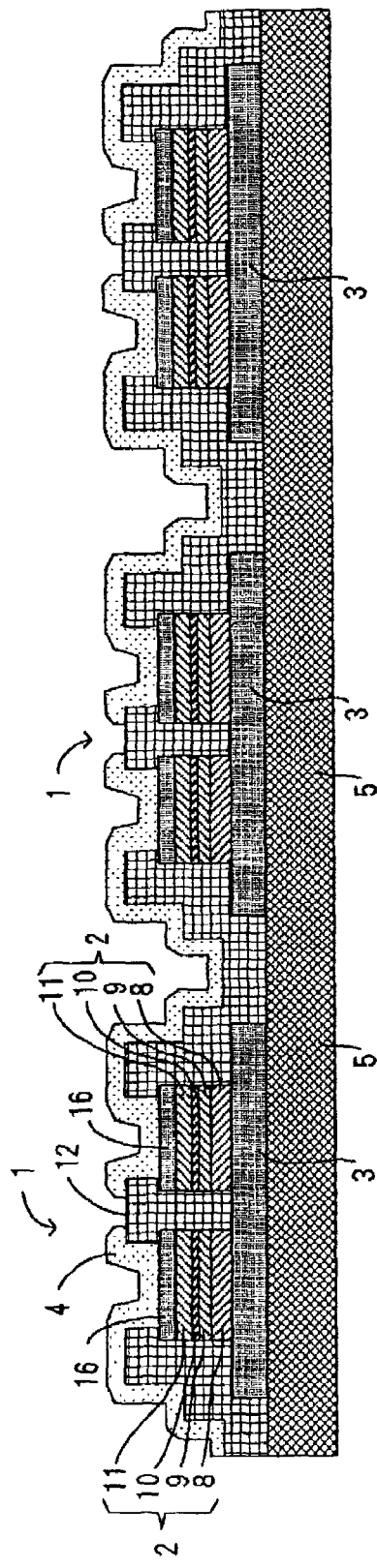
FIG. 8B is a cross-sectional view of the above magnetic resistance device connected linearly in series.

As shown in FIGS. 8A and 8B, in a first connection example, a plurality of pairs of magnetic tunnel resistance devices 2 are connected in series on substrate 5 using magnetic resistance devices 1 (FIG. 4) as in the previously mentioned first variation. Namely, the above magnetic resistance devices 1 are arranged linearly on substrate 5, each of the upper electrodes 4 of adjacent magnetic resistance devices 1 are made to be continuous, and each magnetic tunnel resistance device 2 is connected in series.

Each of the shapes of antiferromagnetic film 8, lower magnetic layer 9, barrier film 10 and upper magnetic layer 11 when viewed in a plan view have the same rectangular shape and are laminated at the same locations. A plurality of lower electrodes 3 formed into a long shape are arranged linearly with the lengthwise direction as the direction of orientation on the same substrate 5. A pair of upper magnetic layers 11 (magnetic tunnel resistance devices 2) are arranged on each lower electrode 3 with each of their short sides opposing each other in parallel, and each of their long sides aligned with the direction of orientation of each lower electrode 3. Furthermore, in order to facilitate understanding of the connection states between lower electrode 3, upper magnetic layer 11 (magnetic tunnel resistance device 2) and upper electrode 4 in FIG. 8A, together with omitting dummy layer 16, the dimensions between lower electrode 3, upper magnetic layer 11 (magnetic tunnel resistance device 2) and upper electrode 4 are shown differently.

In this manner, in an example of connecting a plurality of magnetic resistance devices 1 in series, current input to on upper electrode 4 of a pair of magnetic tunnel resistance device 2 (upper electrode 4 on both ends serves as an input terminal, and a prescribed voltage is applied from the outside) flows toward lower electrode 3 via dummy film 16, upper magnetic layer 11, barrier film 10, lower magnetic layer 9 and antiferromagnetic film 8 of the same magnetic tunnel resistance device 2. Current then flows inside lower electrode 3 in the direction of orientation of magnetic resistance device 1 (direction of the arrow in FIG. 8A) to upper electrode 4 of the other magnetic tunnel resistance device 2 via the other antiferromagnetic film 8, lower magnetic layer 9, barrier film 10, upper magnetic layer 11 and dummy film 16 of the above pair of magnetic tunnel resistance devices 2, and then flows to upper electrode 4 continuous with one of the pair of magnetic tunnel resistance devices 2 of the other magnetic resistance device 1.

Figure 8C:
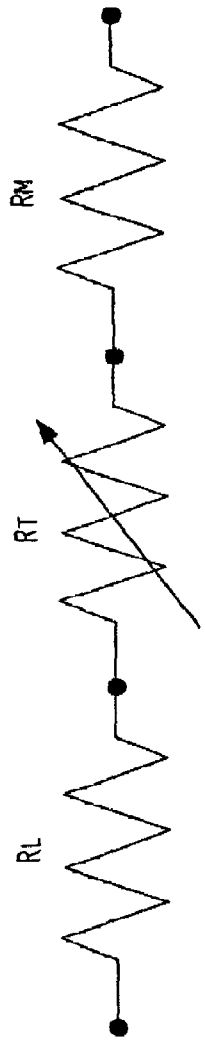
FIG. 8C is an equivalent circuit diagram of the above magnetic resistance device connected linearly in series.

Here, when considering the overall resistance of magnetic resistance device 1, as shown in FIG. 8C, total resistance is comprised of line resistance $R_L$ due to upper electrode 4, tunnel resistance $R_T$ due to barrier film 10, and resistance $R_M$ due to lower electrode 3, and these are connected in series. Of these resistances $R_L$, $R_T$ and $R_M$, the only component for which the resistance value changes relative to a change in the magnetic field is tunnel resistance $R_T$. Consequently, it is necessary to hold resistances $R_L$ and $R_M$ other than resistance $R_T$ of barrier film 10 to a low level to obtain a large magnetic resistance change rate. For example, if the size of the rectangle of the shape of upper magnetic layer 11 when viewed in a plan view is 10 $\mu$m×60 $\mu$m (aspect ratio of "6"), line resistance $R_L$ is several ohms, tunnel resistance is 33 Ω and resistance $R_M$ due to lower electrode 3 is from 20 to 100 Ω. In the case of connecting a plurality of magnetic resistance devices 1 in series, the apparent magnetic resistance change rate is approximately half of the change rate of the tunnel resistance $R_T$. This is because, in contrast to being able to make the film thickness of upper electrode 4 thick at 300–1000 nm, the film thickness of lower electrode 3 cannot be made to be thick for the previously mentioned reason (increasing the thickness of lower electrode 3 causes the formation of pin holes in barrier film 10 via antiferromagnetic film 8 due to the surface roughness of lower electrode 3) and for the reason that lower electrode 3 is cut away by ion beam etching during production.

Next, explanations are provided regarding second and third connection examples in which the arrangement of a pair of magnetic tunnel resistance devices 2 and the arrangement of each magnetic resistance device 1 are altered on a common lower electrode 3 of a single magnetic resistance device 1 in order to reduce resistance $R_M$ due to lower electrode 3 as mentioned above.

Second Connection Example

As shown in FIG. 9A, in this second connection example, a pair of magnetic tunnel resistance devices 2, each shape of which, when viewed in a plan view, has the same rectangular shape, and which are comprised of antiferromagnetic film 8, lower magnetic layer 9, barrier film 10 and upper magnetic layer 11 laminated at the same locations, are arranged on a common lower electrode 3 so that each of their long sides is in parallel and in opposition to each other. A plurality of lower electrodes 3 are arranged linearly on substrate 5, and each upper magnetic layer 11 of each magnetic tunnel resistance device 2 on adjacent lower electrodes 3 is respectively connected by upper electrode 4 so that each of the long sides of the pair of magnetic tunnel resistance devices 2 (upper magnetic layers 11) arranged on different lower electrodes 3 are respectively in parallel and opposing each other. In this case, as shown by the arrows, the current within lower electrode 3 flows in a perpendicular direction to the long sides of each magnetic tunnel resistance device 2.

Third Connection Example

As shown in FIG. 9B, in this third connection example, a pair of magnetic tunnel resistance devices 2 (upper magnetic layers 11) composed in the same manner as the above first example are arranged in two rows above and below in the drawing on a common lower electrode 3 with each long side in parallel and in opposition to each other. A plurality of lower electrodes 3 are arranged linearly on substrate 5, and each upper magnetic layer 11 of the upper or lower row (as shown in the drawing) of two rows of magnetic tunnel resistance devices 2 on adjacent lower electrodes 3 in the horizontal direction in the drawing is connected to the other via a continuous upper electrode 4 in a manner such that the upper electrodes 4 between the upper magnetic layers 11 in the upper row and those in the lower row alternate. In this case as well, current within lower electrode 3 flows in the direction perpendicular to the long sides of each magnetic tunnel resistance device 2 as shown with the arrows. Furthermore, in FIGS. 9A and 9B as well, in addition to omitting dummy layer 16, the dimensions between lower electrode 3, upper magnetic layer 11 (magnetic tunnel resistance device 2) and upper electrode 4 are shown differently in order to facilitate understanding of the connection states between lower electrode 3, upper magnetic layer 11 (magnetic tunnel resistance device 2) and upper electrode 4.

In the second and third connection examples of FIGS. 9A and 9B, since the cross-sectional area of the same lower electrode 3 perpendicular to the direction of current flow is large in comparison with the case of the first connection example of FIG. 8A, resistance $R_M$ due to lower electrode 3 can be reduced. As a result, according to the second and third connection examples, magnetic resistance change rate can be increased to a higher level than the first connection example.

Although an explanation has been provided of the first through third connection examples with respect to the first variation of the above-mentioned example of the basic constitution, this applies similarly to the second through fourth variations along with their additional variations. In this case, in the second variation of FIG. 5, although current flows to both antiferromagnetic film 8 and lower electrode 3 instead of lower electrode 3, the film thickness of antiferromagnetic film 8 can also not be increased for the same reasons as described above. Thus, in this case as well, the cross-sectional area of antiferromagnetic film 8 perpendicular to the direction of current flow should be made to be large in comparison with the case of the first connection example of FIG. 8A in the manner of the above-mentioned second and third connection examples of FIGS. 9A and 9B.

Next, upper magnetic layer 11 (magnetic tunnel resistance device 2) was composed to have long sides measuring 60 $\mu$m and short sides measuring 10 $\mu$m with the composition of the above-mentioned second variation of FIG. 5. Namely, a magnetic tunnel resistance device was composed having an aspect ratio of "6", and 500 magnetic tunnel resistance devices 2 were respectively connected in series in the manner of the above FIGS. 8A, 9A and 9B followed by measuring each magnetic resistance change rate with a magnetic tunnel sensor. According to the measurement results, the magnetic resistance change rates induced by a magnetic field in each of the cases of FIGS. 8A, 9A and 9B were 20%, 28% and 28%, respectively.

On the basis of these experiment results as well, it can be understood that it is preferable to compose upper magnetic layer 11 (magnetic tunnel resistance device 2) to have a rectangular shape, and arrange a pair of magnetic tunnel resistance devices 2 on lower electrode 3 so that the lengthwise directions are parallel and in opposition to each other so that the direction of current flowing between the pair of magnetic tunnel resistance devices 2 is perpendicular to the lengthwise direction of magnetic tunnel resistance device 2.

Fourth Connection Example

Figure 10A:
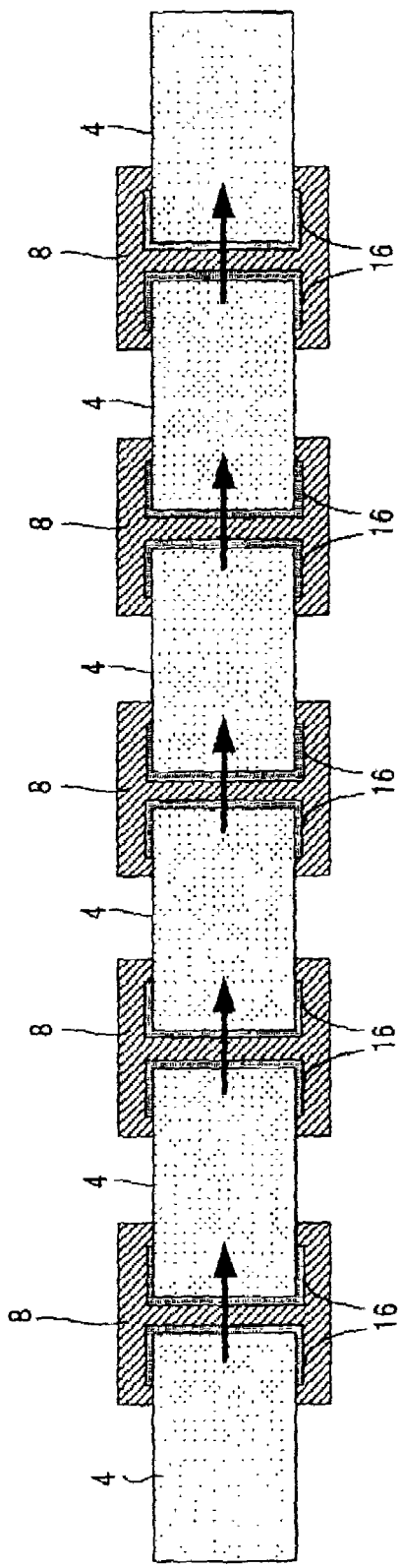
FIG. 10A is a schematic overhead view showing a magnetic resistance device in which a plurality of magnetic tunnel resistance devices as in one embodiment of the present invention are connected linearly in series (fourth connection example).

FIG. 10A is a schematic overhead view of a magnetic resistance device as in a fourth connection example in which a plurality of magnetic tunnel resistance devices are linearly connected in series. Furthermore, the dimensions of each layer are shown differently in FIG. 10A to facilitate understanding of the connection state of each layer.

This magnetic resistance device is equipped with substrate 5 made of, for example, SiO$_2$/Si, glass or quartz. A plurality of lower electrodes 3, in which the shape when viewed in a plan view has been formed as a rectangle, are arranged in a row on substrate 5 in the horizontal direction at prescribed intervals. A non-magnetic conducting material in the form of Cr (or Ti) is formed to a film thickness of about 10 nm on these lower electrodes 3. A plurality of antiferromagnetic films 8, formed to the same shape when viewed in a plan view as lower electrodes 3, made of RhMn and having a film thickness of about 30 nm, are respectively laminated onto each lower electrode 3.

A pair of magnetic tunnel junction structures, each having a laminated structure comprised of lower magnetic layers 9, barrier films 10 and upper magnetic layers 11, are respectively laminated at prescribed intervals on a plurality of antiferromagnetic films 8. The shape of each magnetic tunnel junction structure when viewed in a plan view is respectively formed as a rectangle (for example, 10×60 μm), each long side is respectively arranged to be parallel and opposing each other at a prescribed interval, and the direction of said long sides is perpendicular to the direction in which antiferromagnetic film 8 and lower electrode 3 are arranged. Lower magnetic layers 9 are comprised of NiFe having a film thickness of about 10 nm. Barrier films 10 are comprised of Al$_2$O$_3$ having a film thickness of about 2 nm. Upper magnetic layers 11 are composed to have a bi-layer structure in which a Co film having a film thickness of about 2 nm is used for the lower layer, and an NiFe film having a film thickness of about 20 nm is used for the upper layer.

A pair of magnetic tunnel resistance devices 2 having an aspect ratio of "6" is formed on lower electrode 3 by each laminated structure consisting of antiferromagnetic film 8, lower magnetic layers 9, barrier films 10 and upper magnetic layers 11. In this case, antiferromagnetic film 8 functions as a stationary magnetizing layer for making lower magnetic layers 9 stationary layers, while upper magnetic layers 11 are free layers. Dummy film 16, comprised of a Mo film having a film thickness of about 60 nm and a shape that is identical to each upper magnetic layer 11 when viewed in a plan view, is formed on each upper magnetic layer 11 to provide a margin for the process of forming contact holes by milling.

Together with respectively separating the plurality of lower electrodes 3 and antiferromagnetic films 8, an interlayer insulating film 12 for respectively insulating and separating the pair of magnetic tunnel junction structures provided on each antiferromagnetic film 8 is provided at the region that covers substrate 5 and magnetic tunnel resistance devices 2. This interlayer insulating film 12 is comprised of, for example, SiO$_2$, and is formed to a film thickness of about 250 nm.

Contact holes 13 are respectively formed in this interlayer insulating film 12 on magnetic tunnel resistance devices 2 (dummy layers 16). Together with embedding these contact holes 13, upper electrodes 4 made of aluminum and having a film thickness of, for example, 300 nm are respectively formed so as to mutually and electrically connect one each of the pair of magnetic tunnel resistance devices 2 provided on different lower electrodes 3 and antiferromagnetic films 8. In this manner, each upper magnetic layer 11 and lower magnetic layer 9 of adjacent pairs of magnetic tunnel junction structures are respectively mutually and electrically connected in sequence by lower electrode 3, antiferromagnetic film 8 and upper electrode 4, forming a magnetic resistance device in which a plurality of magnetic tunnel junction structures are connected in series.

Production Method

Next, an explanation is provided of the production method of a magnetic resistance device composed in the manner described above using FIGS. 11A through 11D and FIGS. 12A through 12C. However, FIGS. 11A through 11D and FIGS. 12A through 12C only show one lower electrode 3 and antiferromagnetic film 8, namely one pair of magnetic tunnel resistance devices 2.

(1) Step 1

To begin with, as shown in FIG. 2A, a pre-cleaned substrate 5 made of, for example, SiO$_2$/Si, glass or quartz, is placed in a sputtering apparatus. The chamber of this sputtering apparatus is evacuated to 1×10$^{-7}$ Torr. Argon gas having a purity of, for example, 99.9999% is introduced into the chamber until the pressure reaches 4 mtorr. A Cr (or Ti) film having a film thickness of 10 nm is then deposited on substrate 5 in the form of lower electrode 3 using the sputter gun installed in the chamber (see FIG. 11A).

(2) Step 2

Next, in an argon gas atmosphere at, for example, 4 mtorr, an RhMn film having a film thickness of 30 nm is deposited on lower electrode 3 in the form of antiferromagnetic film 8 using a sputter gun. An NiFe film having a film thickness of 10 nm is deposited on this antiferromagnetic film 8 in the form of lower magnetic layer 9 by the sputter gun (see FIG. 11A).

(3) Step 3

An aluminum film having a film thickness of 2 nm is deposited on lower magnetic layer 9 by the sputter gun. After depositing the aluminum film, substrate 5 is transported to a treatment chamber without breaking the vacuum, pure oxygen is introduced until the pressure in the chamber reaches 100 Torr after which oxidation treatment of the aluminum film is performed by allowing to stand in the chamber for, for example, 20 minutes. As a result, barrier film 10 comprised of aluminum oxide Al$_2$O$_3$ is obtained (see FIG. 11A)

(4) Step 4

Next, a Co film having a film thickness of 2 nm and an NiFe film having a film thickness of 20 nm are sequentially deposited on barrier film 10 in the form of upper magnetic layer 11 by the sputter gun. An Mo film having a film thickness of 60 nm is then deposited on upper magnetic layer 11 in the form of dummy film 16 by the sputter gun (see FIG. 11A).

(5) Step 5

Next, after patterning the upper surface of dummy film 16 with a resist film, the outer edges of dummy film 16, upper magnetic layer 11, barrier film 10, lower magnetic layer 9, antiferromagnetic film 8 and lower electrode 3 are removed by ion beam etching using an ion milling apparatus to form a laminated structure consisting of dummy film 16, upper magnetic layer 11, barrier film 10, lower magnetic layer 9, antiferromagnetic film 8 and lower electrode 3, from which the edges have been removed, on substrate 5. This etching is conditioned on detection of the material (such as $SiO_2/Si$) of substrate 5 dug up by said etching, and is completed after the passage of a certain amount of time after this detection, followed by removal of the resist film with acetone (see FIG. 11B).

(6) Step 6

Next, after patterning the upper surface of dummy film 16 with a resist film, the central portion in the lateral direction shown in the drawing and both edges of dummy film 16, upper magnetic layer 11, barrier film 10 and lower magnetic layer 9 are removed by ion beam etching using an ion milling apparatus to respectively form a pair of laminated structures respectively composed of dummy film 16, upper magnetic layer 11, barrier film 10 and lower magnetic layer 9 on antiferromagnetic film 8. Furthermore, in this case, etching is conditioned on the detection of the material (RhMn) of antiferromagnetic film 8 dug up by said etching, and is completed at the time of said detection or after the passage of a certain amount of time after said detection (see FIG. 11C).

(7) Step 7

Next, the product on which the above step 6 has been completed is placed in a vacuum chamber of a sputtering apparatus. After evacuating the inside of the vacuum chamber to, for example, $2.0 \times 10^{-6}$ Torr or lower, argon gas is introduced at 5 mtorr followed by covering substrate 5 with interlayer insulating film 12 comprised of $SiO_2$ having a film thickness of 250 nm (see FIG. 11D).

(8) Step 8

Next, after patterning the upper surface of the deposited interlayer insulating film 12 with a resist film, the interlayer insulating film 12 over each dummy film 16 is removed by ion beam etching using an ion milling apparatus to form each contact hole 13 in interlayer insulating film 12. The completion of this etching is conditioned on the detection of the material (Mo) of dummy film 16 dug up by said etching, and is completed at the time of said detection or after the passage of a certain amount of time after said detection followed by the removal of the resist film using, for example, acetone (see FIG. 12A).

(9) Step 9

Next, the product in which formation of contact holes 13 has been completed is placed in a vacuum chamber, and the inside of the vacuum chamber is evacuated to a vacuum of $2.0 \times 10^{-6}$ Torr or lower, followed by the introduction of argon gas at a pressure of, for example, 5 mtorr. Upper electrode 4 comprised of an aluminum film having a film thickness of 300 nm is then formed (see FIG. 12B).

(10) Step 10

Figure 10B:
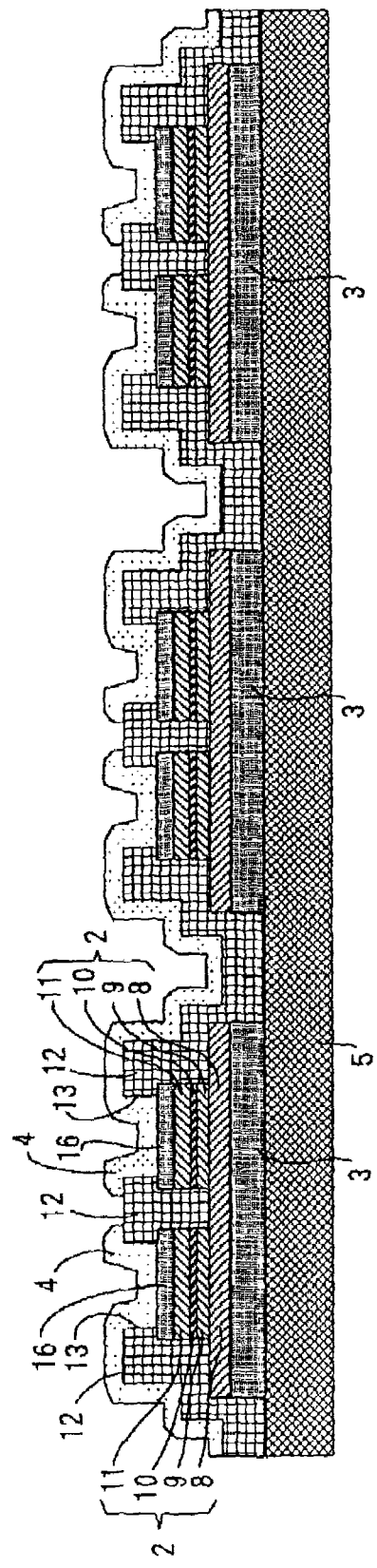
FIG. 10B is a cross-sectional view of the above magnetic resistance device.
Figure 11A:
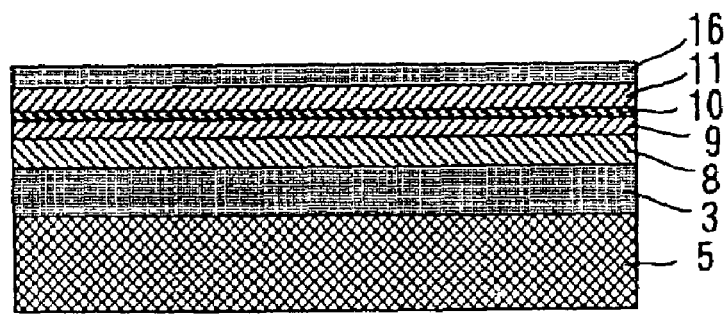
FIGS. 11A through 11D are cross-sectional views showing the production of the above magnetic resistance device in the order of the production sequence.
Figure 11B:
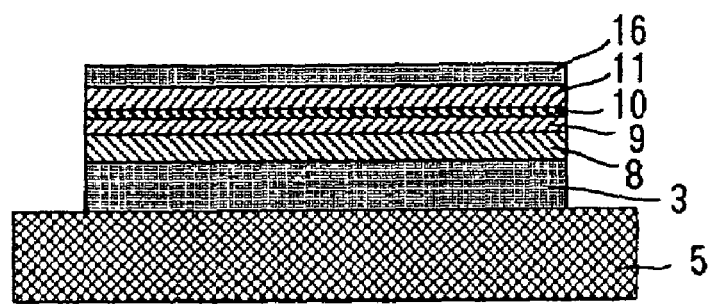
Figure 11C:
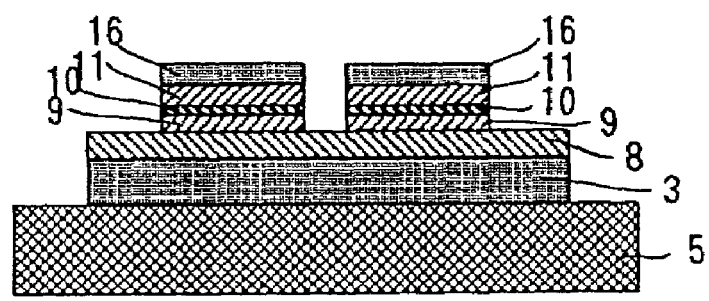
Figure 11D:
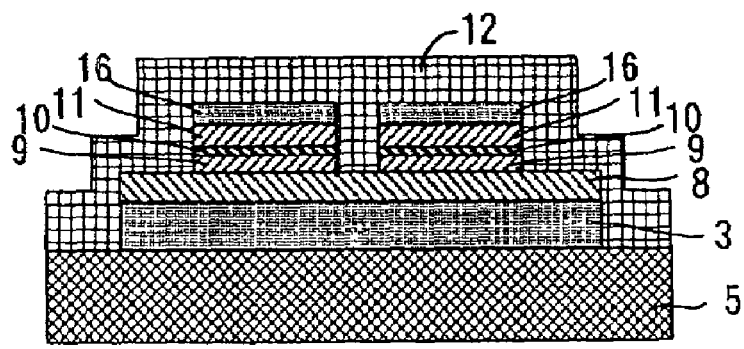
Figure 12A:
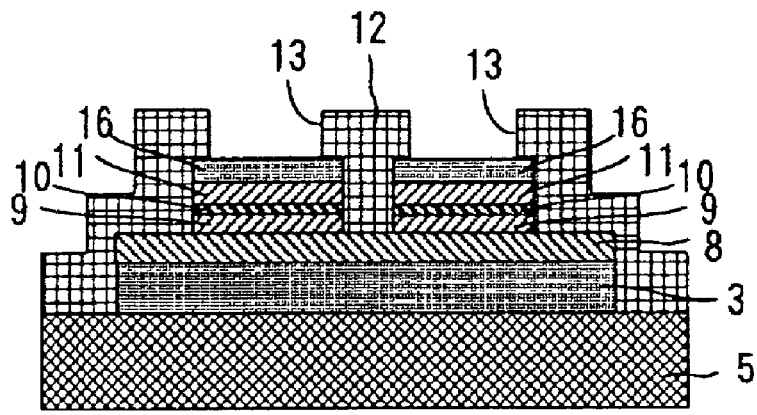
FIGS. 12A through 12C are cross-sectional views of a magnetic resistance device showing the next step of FIG. 11 in the order of the production sequence.
Figure 12B:
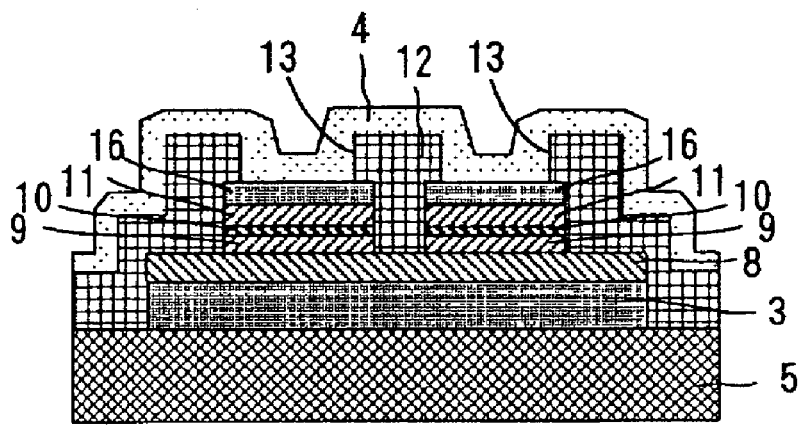
Figure 12C:
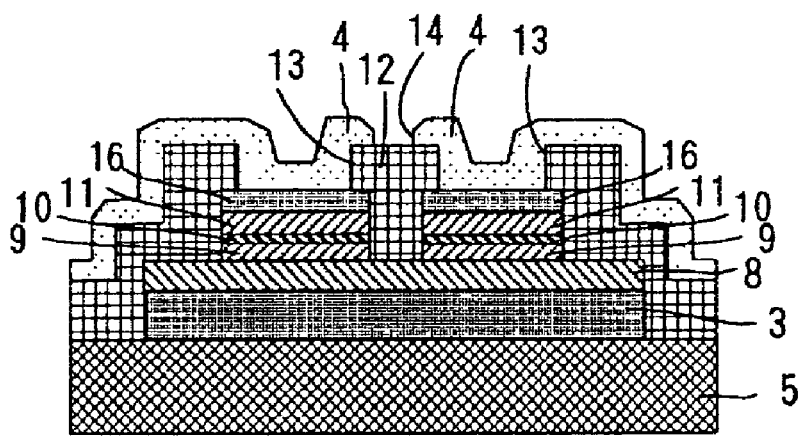

Next, after patterning the upper surface of the deposited upper electrode 4 with a resist film, the center of upper electrode 4 (notch 14) is removed by ion beam etching using an ion milling apparatus to separate upper electrode 4 into two sections. This etching is conditioned on detection of the material ($SiO_2$) of interlayer insulating film 12 dug out by said etching, and is completed after the passage of a certain amount of time after this detection, followed by removal of the resist film using, for example, acetone following completion of said etching. As a result, magnetic resistance device 1 using magnetic tunnel effects shown in FIGS. 10A and 10B is formed (see FIG. 12C).

In this manner, in the ion beam etching of the above steps 5, 6, 8 and 10, since ion beam etching stops as a result of detecting the material component of the layer beneath an unnecessary portion, a portion of the upper surface of said layer positioned beneath is also removed in order to reliably remove said unnecessary portion.

Furthermore, in the magnetic resistance device of the above constitution, if the film thickness between barrier film 10 and substrate 5 exceeds 100 nm, surface roughness increases that causes the occurrence of pin holes in barrier film 10. Thus, it is necessary that this film thickness not exceed 100 nm.

Explanation of Operation

As a result of connecting a plurality of magnetic tunnel junction structures (magnetic tunnel resistance devices 2) in series in this manner, the current input to one upper electrode 4 (upper electrodes 4 on both ends serve as input terminals, and a prescribed potential is applied to these terminals from the outside) of the pair of magnetic tunnel junction structures formed on a common antiferromagnetic film 8 flows toward antiferromagnetic film 8 and lower electrode 3 via dummy film 16, upper magnetic layer 11, barrier film 10 and lower magnetic layer 9 of the same magnetic tunnel junction structure. Current then flows through antiferromagnetic film 8 and lower electrode 3 in direction of orientation of said antiferromagnetic film 8 and lower electrode 3 (direction of the arrow in FIG. 10A), flows to upper electrode 4 of the other magnetic tunnel junction structure via the other lower magnetic layer 9, barrier film 10, upper magnetic layer 11 and dummy film 16 of the above pair of magnetic tunnel junction structures, and finally flows to one of the upper electrodes 4 that is electrically connected of the pair of magnetic tunnel junction structures formed on the other antiferromagnetic film 8 and upper electrode 3.

Here, when considering the overall resistance of magnetic resistance device 1, total resistance is comprised of line resistance $R_L$ due to upper electrode 4, tunnel resistance $R_T$ due to barrier film 10, and resistance $R_M$ due to antiferromagnetic film 8 and lower electrode 3, and these are connected in series. Of these resistances $R_L$, $R_T$ and $R_M$, the only component for which the resistance value changes relative to a change in the magnetic field is tunnel resistance $R_T$. Consequently, it is necessary to hold resistances $R_L$ and $R_M$ other than resistance $R_T$ of barrier film 10 to a low level to obtain a large magnetic resistance change rate. For example, if the size of the rectangle of the shape of magnetic resistance devices 2 when viewed in a plan view is 10 $\mu m \times 60 \mu m$ (aspect ratio of "6"), line resistance $R_L$ is several ohms, tunnel resistance is 33 $\Omega$ and resistance $R_M$ due to antiferromagnetic film 8 and lower electrode 3 is from 5 to 25 $\Omega$ per single magnetic tunnel resistance device 2. In the case of connecting a plurality of magnetic resistance devices 1 in series, the apparent magnetic resistance change rate is approximately half of the change rate of the tunnel resistance $R_T$.

This is because, in contrast to being able to make the film thickness of upper electrode 4 thick at 300–1000 nm, the film thickness of antiferromagnetic film 8 and lower electrode 3 cannot be made to be too thick so as to not make the surface rough and prevent the occurrence of pin holes in barrier film 10. Thus, it is necessary to facilitate the flow of current through antiferromagnetic film 8 and lower electrode 3 in the direction of the above-mentioned arrow of FIG. 10A. Namely, it is necessary to lower the resistance due to antiferromagnetic film 8 and lower electrode 3 in the direction of the arrow. According to the present embodiment composed in the manner described above, a pair of magnetic tunnel junction structures comprised of lower magnetic layer 9, barrier film 10 and upper magnetic layer 11 were formed on a plurality of common antiferromagnetic films 8, the shape of said pair of magnetic tunnel junction structures when viewed in a plan view was made to be rectangular, and each of the long sides of said rectangle were made to be in parallel and opposing each other. As a result, since the cross-sectional areas of antiferromagnetic film 8 and lower electrode 3 that are perpendicular to the direction of current flow become larger in comparison with the case of the first connection example of FIG. 8A, the resistance value of antiferromagnetic film 8 and lower electrode 3 can be held to a low level, thereby making it possible to maintain a high magnetic resistance change rate. In addition, since a large number of magnetic tunnel resistance devices 2 are connected in series, even if a large voltage is applied overall, the voltage applied to a single magnetic tunnel resistance device 2 can be held to a low level, thereby making it possible to obtain a large detection voltage while maintaining a high magnetic resistance change rate.

Fifth Connection Example

Figure 13A:
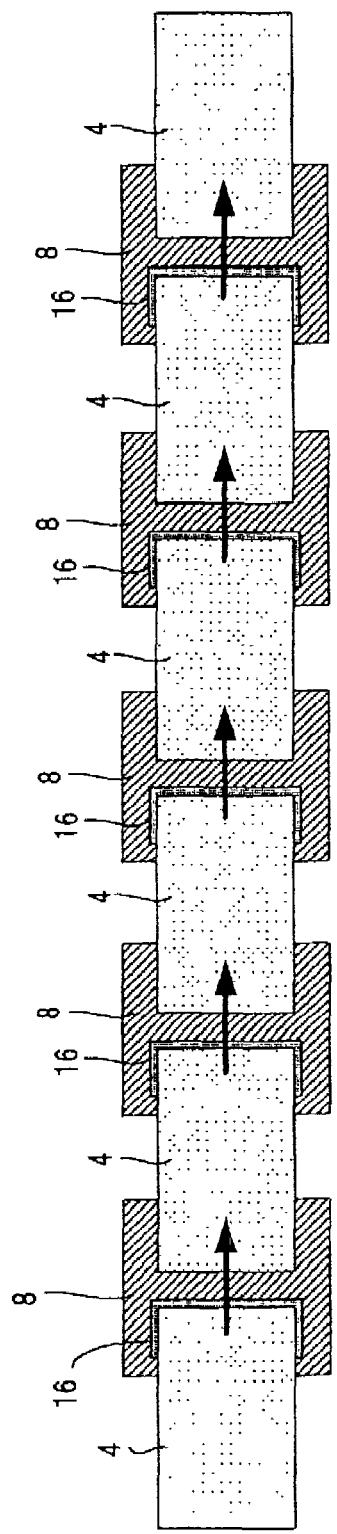
FIG. 13A is a schematic overhead view showing a magnetic resistance device as in a variation of the above fourth connection example (fifth connection example).
Figure 13B:
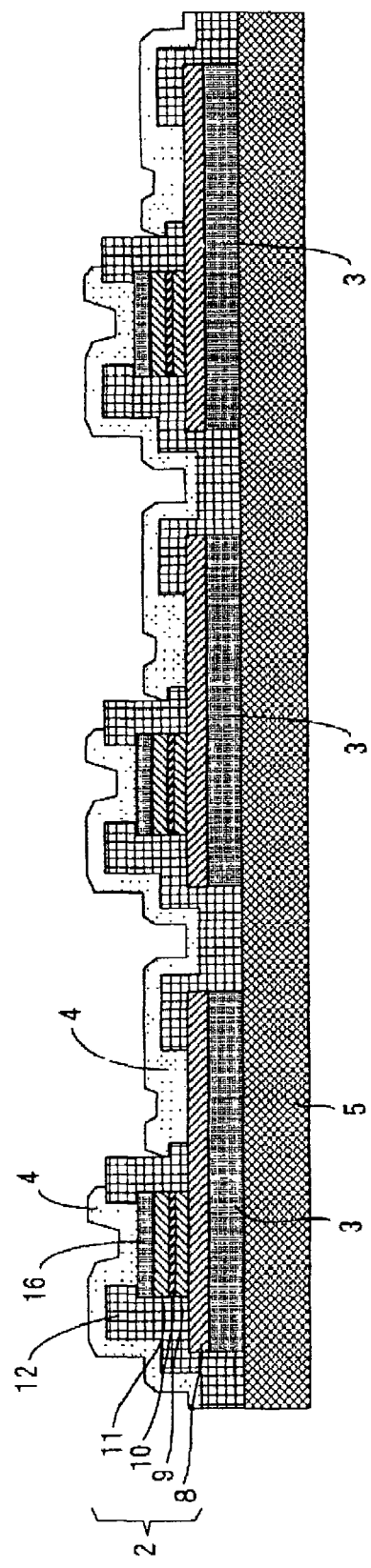
FIG. 13B is a cross-sectional view of the above magnetic resistance device.

Next, the following provides an explanation of a fifth connection example in which only a single magnetic tunnel junction structure is equipped on a single antiferromagnetic film 8, and a plurality of magnetic tunnel junction structures are connected in series. FIG. 13A is a schematic overhead view of the magnetic resistance device as in this fifth connection example, while FIG. 13B is a cross-sectional view of the same magnetic resistance device. Furthermore, in FIG. 13A as well, the dimensions of each layer may be shown differently from those in FIG. 13B to facilitate understanding of the connection state of each layer.

In this case, together with a pair of laminated structures comprised of dummy film 16, upper magnetic layer 11, barrier film 10 and lower magnetic layer 9 and provided on antiferromagnetic film 8 of the above fourth connection example, and respectively forming only a single laminated structure comprised of dummy film 16, upper magnetic layer 11, barrier film 10 and lower magnetic layer 9 on antiferromagnetic film 8, said antiferromagnetic film 8 is electrically connected by upper electrode 4 to dummy film 16 of the single laminated structure comprised of dummy film 16, upper magnetic layer 11, barrier film 10 and lower magnetic layer 9 provided on an adjacent antiferromagnetic film 8. Since other structures are the same as in the above fourth connection example, and the production method is also nearly the same as that of the fourth connection example, their explanations are omitted.

As a result, by sequentially and electrically connecting antiferromagnetic film 8 of each magnetic tunnel junction structure to upper magnetic layer 11 of the adjacent magnetic tunnel junction structure in one direction, a constitution is realized wherein a plurality of magnetic tunnel junction structures are connected in series. In this case as well, since current flows through antiferromagnetic film 8 and lower electrode 3 in the direction of the arrow of the above FIG. 13A, and the cross-sectional area of antiferromagnetic film 8 and lower electrode 3 perpendicular to the direction of current flow can be made larger in comparison with the case of the second comparative example of FIG. 15B, the resistance of antiferromagnetic film 8 and lower electrode 3 can be held to a low level, thereby making it possible to maintain a high magnetic resistance change rate.

Sixth Connection Example

Figure 14:
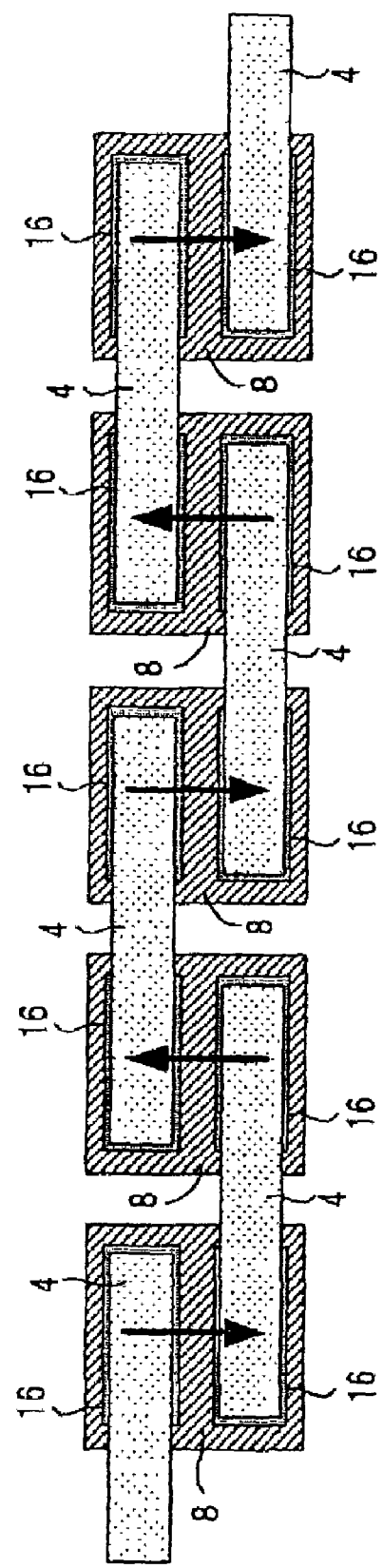
FIG. 14 is a schematic overhead view showing a magnetic resistance device as in a variation of the above fourth connection example (sixth connection example).

A plurality of magnetic tunnel junction structures can also be connected in series as shown as a sixth connection example in FIG. 14. In this case, although a pair of laminated structures respectively comprised of dummy film 16, upper magnetic layer 11, barrier film 10 and lower magnetic layer 9 are formed on a common antiferromagnetic film 8 in the same manner as the above fourth connection example, each long side of each laminated structure is in parallel and opposing each other and arranged in two rows above and below in the drawing. A plurality of lower electrodes 3 and antiferromagnetic films 8 are arranged linearly on substrate 5 so that the upper and lower two rows of magnetic tunnel resistance devices 2 on each antiferromagnetic film 8 are in two straight lines each in the direction of each of their long sides, and each dummy film 16 of the two upper and lower rows of magnetic tunnel resistance devices 2 on adjacent antiferromagnetic films 8 in the horizontal direction in the drawing is mutually connected above and below by making them respectively continuous with upper electrode 4. Furthermore, since the other structures are the same as the above fourth connection example, and the production method is also nearly the same as that of said fourth connection example, their explanations are omitted.

In this case as well, the current through antiferromagnetic film 8 and lower electrode 3 flows in a direction perpendicular to the long sides of each magnetic tunnel resistance device 2 as shown with the arrows in the drawing. Thus, since the cross-sectional area of antiferromagnetic film 8 and lower electrode 3 perpendicular to the direction of current flow can be made larger in comparison with the case of the second comparative example of FIG. 15B, the resistance of antiferromagnetic film 8 and lower electrode 3 can be held to a low level, thereby making it possible to maintain a high magnetic resistance change rate.

Figure 15A:
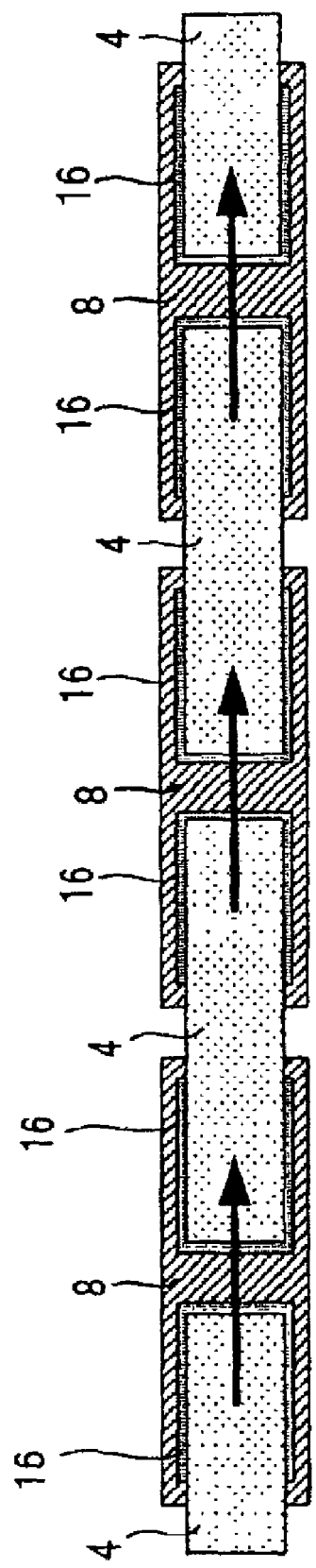
FIG. 15A is a schematic overhead view of a magnetic resistance device as in a first comparative example in which a plurality of magnetic tunnel resistance devices are connected in series to evaluate the performance of the magnetic resistance device as in the above fourth through sixth connection examples.
Figure 15B:
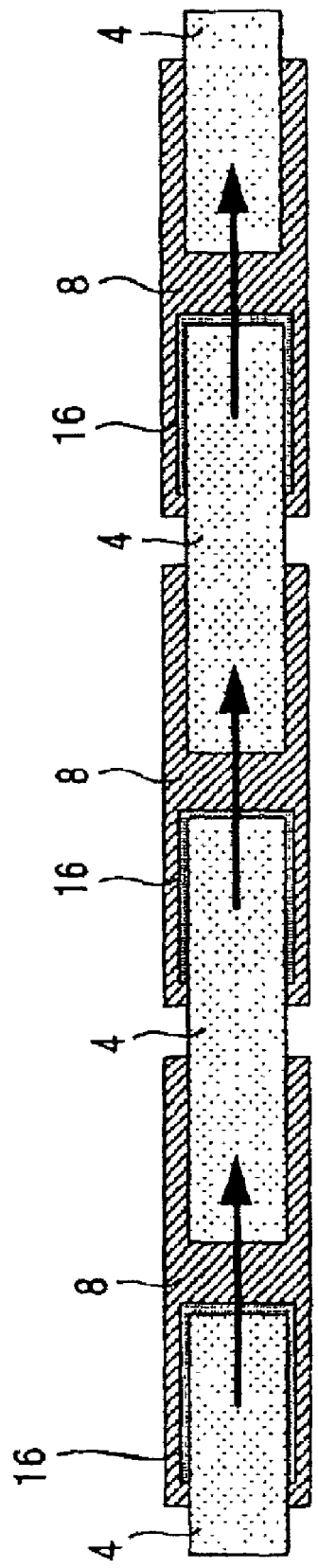
FIG. 15B is a schematic overhead view of a magnetic resistance device as in a second comparative example for the same purpose.

Here, an explanation is provided of the results of experimentally confirming each magnetic resistance change rate for these fourth through sixth connection examples. In this experiment, although the shape of the magnetic tunnel junction structure (magnetic tunnel resistance device 2) when viewed in a plan view was made to have a rectangular shape (magnetic tunnel resistance device 2 comprised of long sides measuring 60 $\mu$m and short sides measuring 10 $\mu$m and having an aspect ratio of "6") employing the same constitution as in the case of the above fourth through sixth connection examples, the magnetic resistance change rate was also measured for comparative examples in which the direction of the long sides was in the same direction as the direction of orientation of each magnetic resistance tunnel device 2. Namely, together with providing a pair of laminated structures comprised of dummy film 16, upper magnetic layer 11, barrier film 10 and lower magnetic layer 9, in which the direction of the long sides is made to be the direction of orientation of magnetic tunnel resistance device 2, on a single antiferromagnetic element 8, that in which dummy films 16 on different antiferromagnetic films 8 are electrically connected with upper electrode 4 is used as Comparative Example 1 as shown in FIG. 15A. In addition, together with providing a pair of laminated structures comprised of dummy film 16, upper magnetic layer 11, barrier film 10 and lower magnetic layer 9, which the direction of the long sides is the direction of orientation of magnetic tunnel resistance device 2, on a single antiferromagnetic film 8, that in which dummy films 16 on the same antiferromagnetic film 8 and a different antiferromagnetic film 8 are electrically connected with upper electrode 4 is used as Comparative Example 2 as shown in FIG. 15B. In addition, in this experiment, 500 magnetic tunnel resistance devices 2 were respectively connected in series in both cases. These measurement results are shown in Table 1 below.

TABLE 1

| Connection example of magnetic tunnel resistance device 2 | Rate of change in magnetic resistance induced by magnetic field (%) |
|---|---|
| Fourth connection example (FIG. 10A) | 28 |
| Fifth connection example (FIG. 13A) | 25 |
| Sixth connection example (FIG. 14) | 28 |
| First comparative example (FIG. 15A) | 18 |
| Second comparative example (FIG. 15B) | 15 |

On the basis of these experimental results as well, it can be understood that it is preferable to compose the shape of a magnetic tunnel junction structure (magnetic tunnel resistance device 2) when viewed in a plan view in the shape of a rectangle, and arrange said structure so that the direction of the long sides of the same rectangular shape are mutually parallel and opposing each other so that the direction of current flowing between magnetic tunnel resistance devices 2 is perpendicular to the direction of the long sides of magnetic tunnel resistance device 2.

Variations of the Laminated Structure

Next, an explanation is provided of variations of the laminated structure comprised of the above-mentioned lower electrode 3, antiferromagnetic film 8, lower magnetic layer 9, barrier film 10, upper magnetic layer 11 and dummy film 16.

Figure 16:
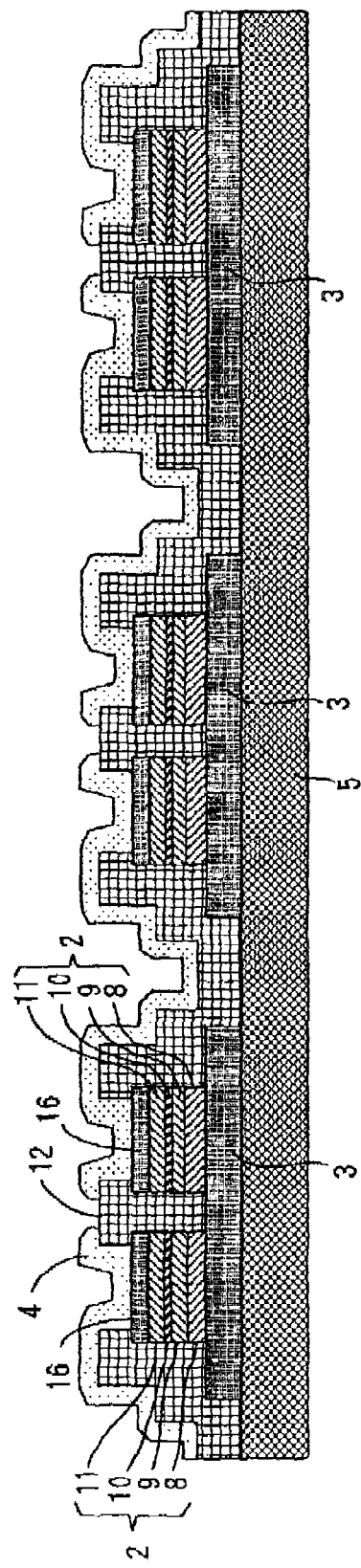
FIG. 16 is a cross-sectional view of a magnetic resistance device showing a first variation of the laminated structure.

In a first variation as shown in FIG. 16, together with forming a plurality of lower electrodes 3 on substrate 5, a pair of independent laminated structures comprised of antiferromagnetic film 8, lower magnetic layer 9, barrier film 10, upper magnetic layer 11 and dummy film 16 are respectively formed on each lower electrode 3.

Figure 17:
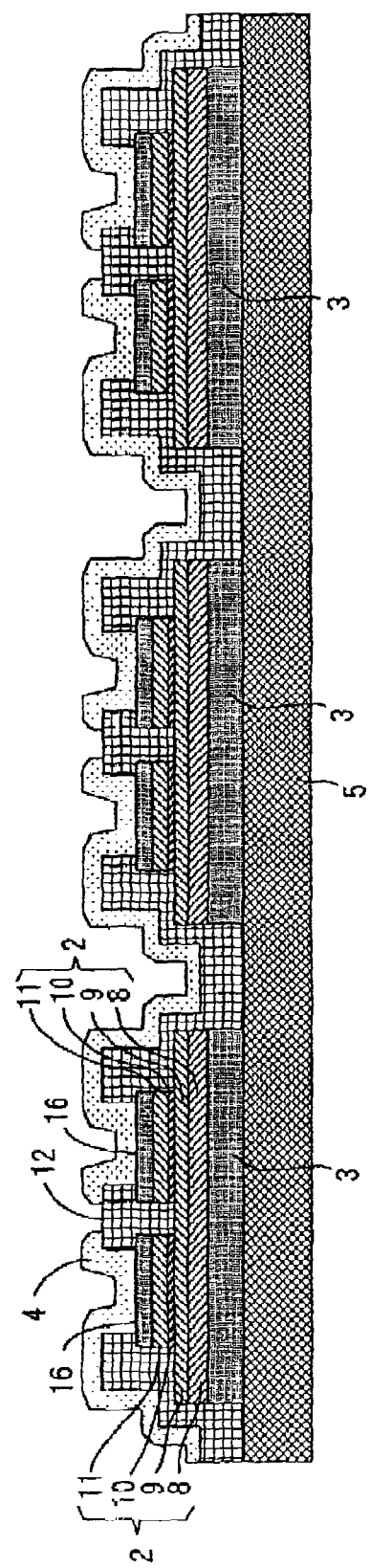
FIG. 17 is a cross-sectional view of a magnetic resistance device showing a second variation of the laminated structure.

In a second variation as shown in FIG. 17, a plurality of laminated structures comprised of lower electrode 3, antiferromagnetic film 8 and lower magnetic layer 9 are formed on substrate 5, and a pair of independent laminated structures comprised of barrier film 10, upper magnetic layer 11 and dummy film 16 are respectively formed on each lower magnetic layer 9.

Figure 18:
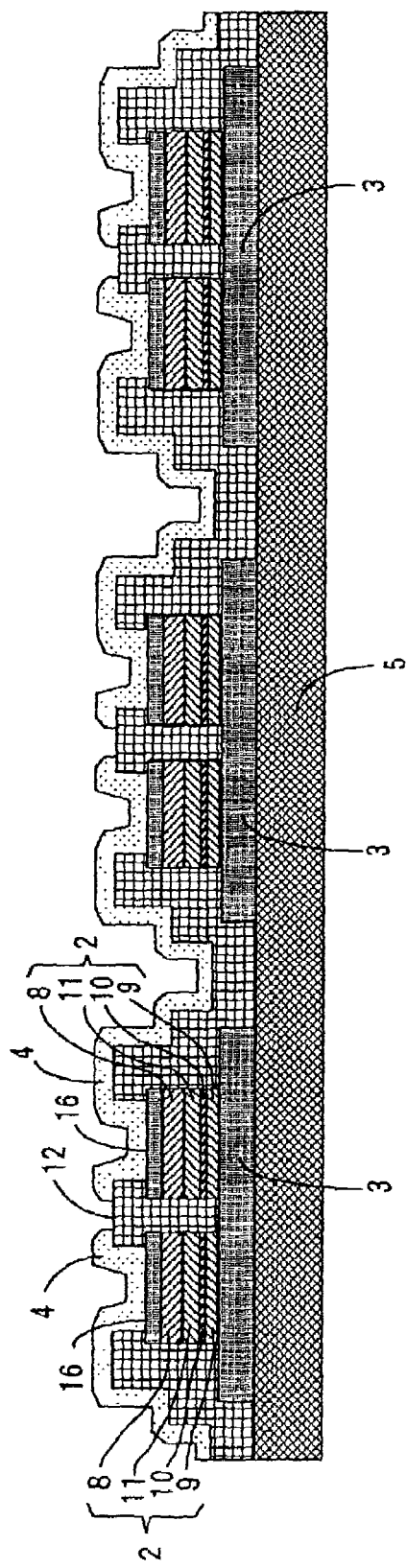
FIG. 18 is a cross-sectional view of a magnetic resistance device showing a third variation of the laminated structure.

In a third variation as shown in FIG. 18, antiferromagnetic film 8 of the above first variation is respectively provided between each upper magnetic layer 11 and each dummy film 16. According to this, together with upper magnetic layers 11 functioning as stationary layers, lower magnetic layers 9 function as free layers.

Figure 19:
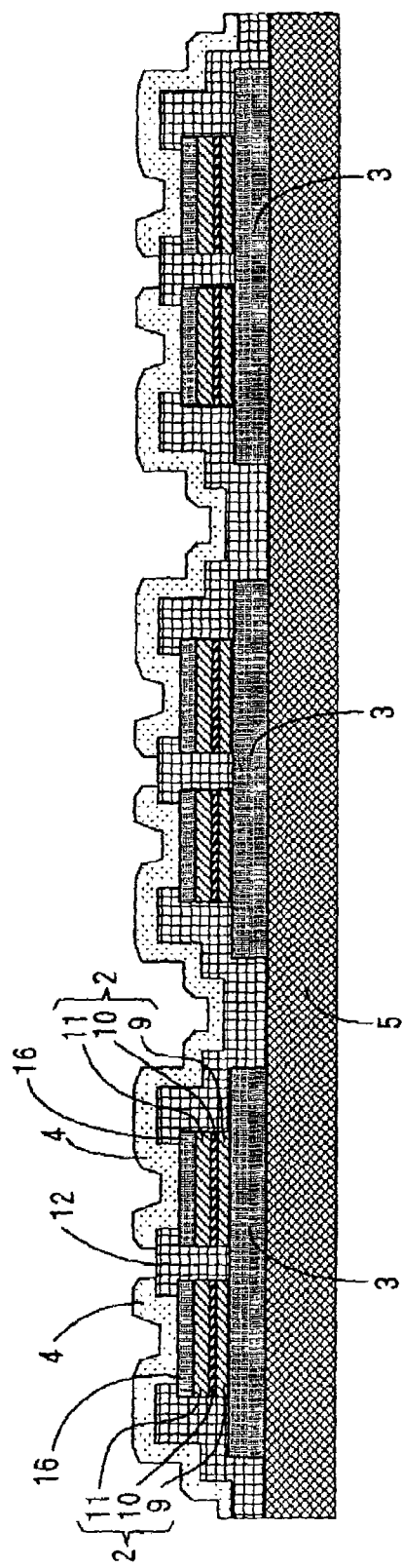
FIG. 19 is a cross-sectional view of a magnetic resistance device showing a fourth variation of the laminated structure.

In a fourth variation as shown in FIG. 19, antiferromagnetic film 8 of the above first through third variations is omitted, and a pair of magnetic tunnel resistance devices 2 are composed only of lower magnetic layers 9, barrier films 10 and upper magnetic layers 11. In this case, a somewhat large difference in coercive force is provided between each lower magnetic layer 9 and each upper magnetic layer 11, which together with allowing that having the smaller coercive force to function as the free layer, allows that having the larger coercive force to function as the stationary layer. In addition, in this fourth variation as well, a plurality of laminated structures comprised of lower electrode 3 and lower magnetic layer 9 may be formed on substrate 5, and a pair of independent laminated structures comprised of barrier film 10, upper magnetic layer 11 and dummy film 16 may be respectively formed on each lower magnetic layer 9.

In each of these variations relating to the laminated structure, in addition to being able to use the same materials as in the laminated structures previously described, since similar methods can be employed for the production method, explanations of these are omitted. The above-mentioned fourth through sixth connection examples and matrix structures can be used in each of these variations relating to the laminated structure.

Furthermore, in each of the above variations of the laminated structure, although antiferromagnetic film 8 made of RhMn is used as a stationary magnetizing layer in order to use lower magnetic layer 9 or upper magnetic layer 11 as a stationary layer, this antiferromagnetic layer 8 may be made of FeMn, PtMn and so forth instead of RhMn.

In addition, ferromagnetic films made of CoPtCr and so forth and having a thickness of about 30 nm can respectively be used in place of these antiferromagnetic films 8 as a stationary magnetizing layer for using lower magnetic layer 9 or upper magnetic layer 11 as a stationary layer. As a result of using a ferromagnetic film made of CoPtCr, in addition to the effects produced by the above first through fourth variations, there is also the additional effect of satisfactory temperature characteristics. In addition, ferromagnetic films having sufficiently large coercive force such as that made of CoTaCr can also be used instead of the above ferromagnetic film made of CoPtCr.

In addition, in each of the above examples, although an aluminum film was subjected to oxidation treatment by allowing to stand for 20 minutes in a pure oxygen chamber by treatment in the previously described step 3 to form barrier film 10, this ultimately results in a normalized resistance value of about 20 k$\Omega \cdot \mu m^2$ per single magnetic tunnel resistance device 2. Thus, the thickness of the above aluminum film may be increased and the above duration of oxidation treatment may be extended to increase this normalized resistance value. As a result, the above normalized resistance value can be increased up to about 200 k$\Omega \cdot \mu m^2$. In addition, the above normalized resistance value can also be further increased to 1 M$\Omega \cdot \mu m^2$ by introducing oxygen at 100 mtorr into a vacuum chamber after deposition, generating oxygen plasma using a high frequency of, for example, 13.56 MHz, and exposing the aluminum film to this oxygen plasma for, for example, 1 minute.

In addition, although the production method of barrier film 10 uses a method that uses pure oxygen in the present embodiment, the present invention is not limited to this in particular, but rather other methods can also be used, such as natural oxidation or oxidizing the aluminum film by irradiating with an oxygen ion beam instead of oxygen plasma.

In this manner, although the normalized resistance value of magnetic tunnel resistance device 2 can be adjusted to various extents, since an increase in this normalized resistance value leads to an increase in the effect of thermal noise, it is necessary to suppress this normalized resistance value to a certain extent corresponding to the particular application.

In addition, although Cr, Ti and so forth are used for the material of lower electrode 3 in the previously described example of the basic constitution and in each of its variations, this material is not limited to these, but rather other conductive non-magnetic metal materials can also be used, examples of which include Cu, W, Ta, Au and Mo. In addition, various types of conductive non-magnetic metal materials as listed above can also be used for upper electrode 11 and dummy film 16 in addition to Cr and Ti.

In addition, in a magnetic sensor using a magnetic resistance device composed in the manner described above, these sensors may be connected in series while also being connected in series with the reference resistor, or may be used by incorporating as one side of a Wheatstone bridge. In these cases as well, a reference resistor and resistor within the Wheatstone bridge should be formed on a substrate 5.

d. Aspect Ratio

The following provides an explanation of the aspect ratio of magnetic tunnel resistance device 2. Furthermore, in the case lower magnetic layer 9, barrier film 10 and upper magnetic layer 11 have the same surface area, same shape and are superimposed on each other at the same location, aspect ratio refers to the ratio of the length in the direction of their long sides to the length in the direction of their short sides for each of their shapes when viewed in a plan view. For example, as shown in FIG. 1, in the case lower magnetic layer 9, barrier film 10 and upper magnetic layer 11 do not have the same surface area and shape, aspect ratio refers to the ratio of the length of in the direction of the long sides to the length in the direction of the short sides of upper magnetic layer 11 or lower magnetic layer 9 which serves as the free layers. According to the experiments and experience of the present inventors, it was found that the greater this aspect ratio, the smaller the effect of Barkhausen noise, thereby resulting in lower levels of distortion in output waveform signals.

The following describes the results of an experiment conducted on magnetic resistance device 1 shown in FIG. 1. In this case, the shape of each upper magnetic layer (free layer) 11, when viewed in a plan view, of the magnetic resistance device 1 of FIG. 1 is respectively composed in the shape of a rectangle, and two samples were prepared consisting of sample 1, in which the long sides measure 40 μm and the short sides measure 20 μm yielding an aspect ratio of "2", and sample 2, in which the long sides measure 80 μm and the short sides measure 20 μm yielding an aspect ratio of "4". Five magnetic resistance devices 1 each were connected in series for samples 1 and 2 (10 magnetic tunnel resistance devices 2 were connected in series), and the magnetic field was changed from a pattern in which N and S poles having a width of 50 μm were alternately arranged to obtain an output voltage waveform of each cycle by detecting the change in their respective resistance values (output voltages).

Figure 20A:
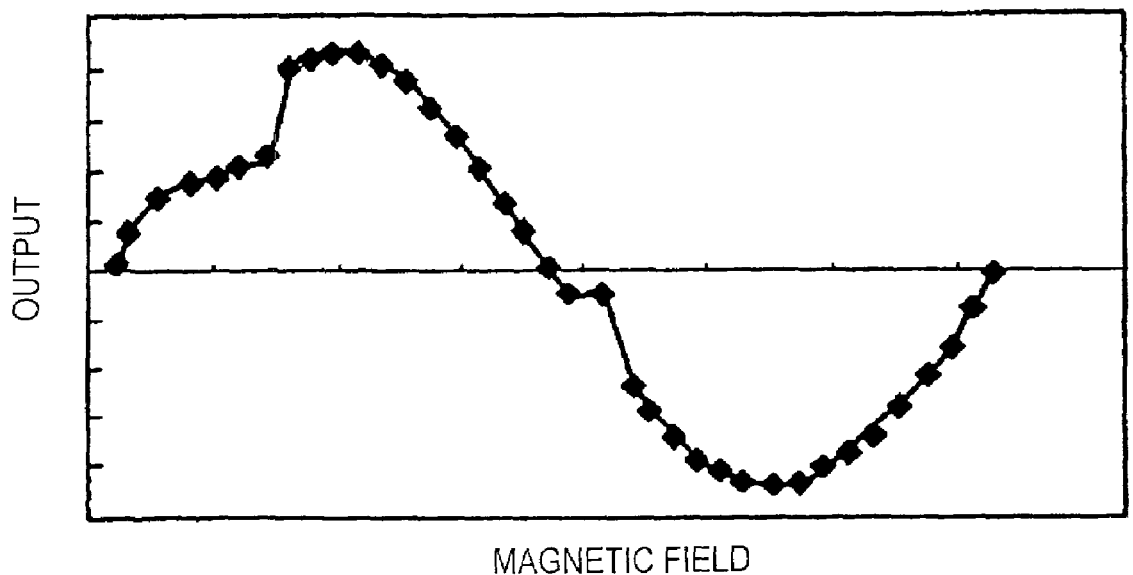
FIG. 20A shows the measurement results following measurement of the output voltage waveform of a magnetic tunnel resistance device in which the aspect ratio is "2" by changing the magnetic field.
Figure 20B:
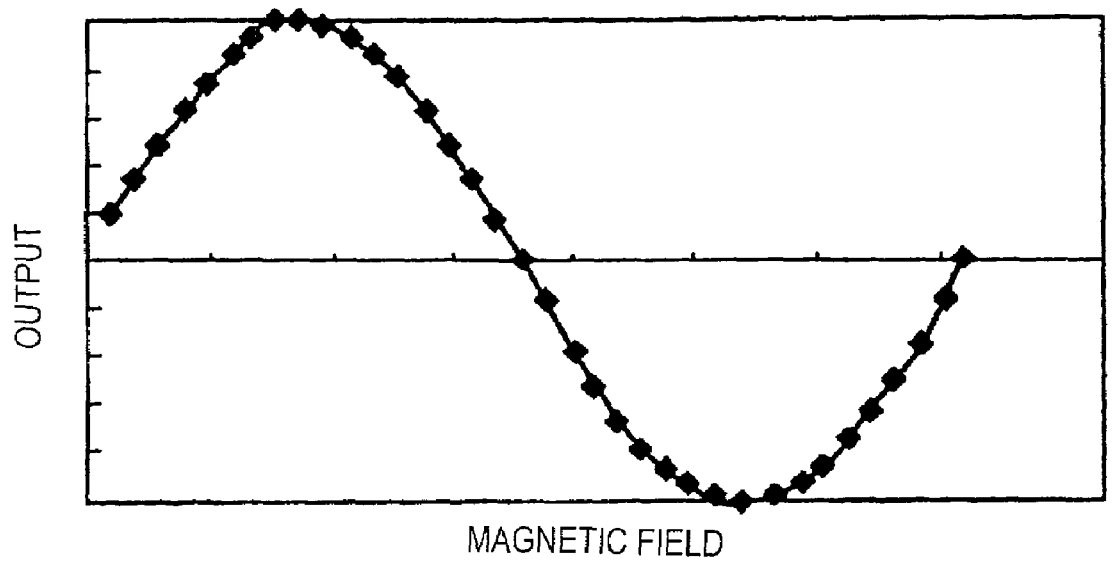
FIG. 20B shows the measurement results following measurement of the output voltage waveform of a magnetic tunnel resistance device in which the aspect ratio is "4" by changing the magnetic field.

In the device in which 10 magnetic tunnel resistance devices 2 having an aspect ratio of "2" were connected in series, slight distortion occurred in the output waveform as shown in FIG. 20A. On the other hand, in the device in which 10 magnetic tunnel resistance devices 2 having an aspect ratio of "4" were connected in series, the above distortion disappeared from the output waveform resulting in a uniform sine wave waveform as shown in FIG. 20B. The above distortion is believed to be caused by Barkhausen noise, and on the basis of these experimental results as well, the larger the aspect ratio, the lesser the occurrence of disturbances in the output voltage, thereby making it possible to confirm that a magnetic resistance sensor of high accuracy can be produced. Furthermore, in each of the above variations of the example of the basic constitution, the resulting device was more favorable the larger the aspect ratio.

e. Matrix Connection Examples

Next, an explanation is provided regarding preferable embodiments for connecting a large number of magnetic tunnel junction structures (magnetic tunnel resistance devices 2) in series. In the case of connecting a large number of magnetic tunnel resistance devices 2 in series, since the length increases as the number of magnetic tunnel resistance devices 2 becomes numerous in the previously described connection examples, a structure should be employed in which the rows of devices are turned around at some intermediate point to form a matrix (Miranda).

Figure 21:
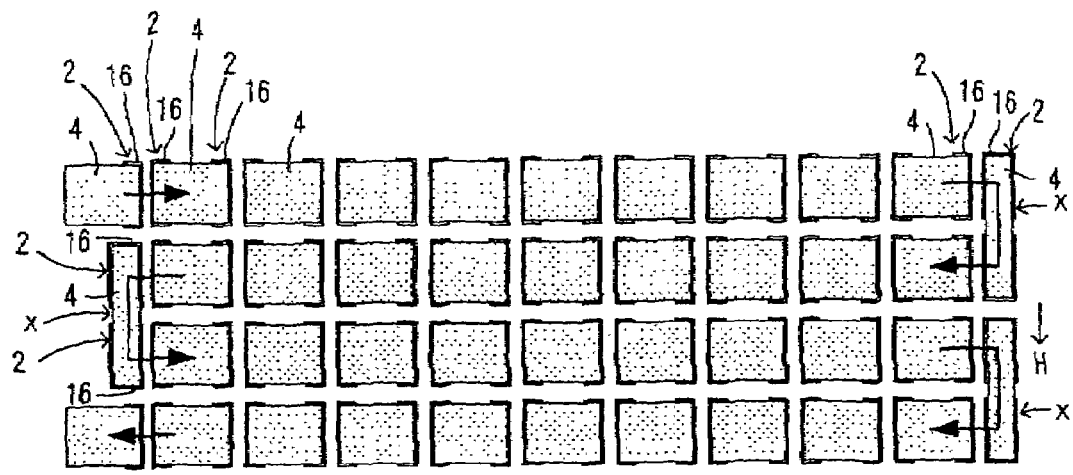
FIG. 21 is a schematic overhead view of a magnetic resistance device having a first matrix structure in which a plurality of magnetic resistance devices are arranged in the form of a matrix.
Figure 22:
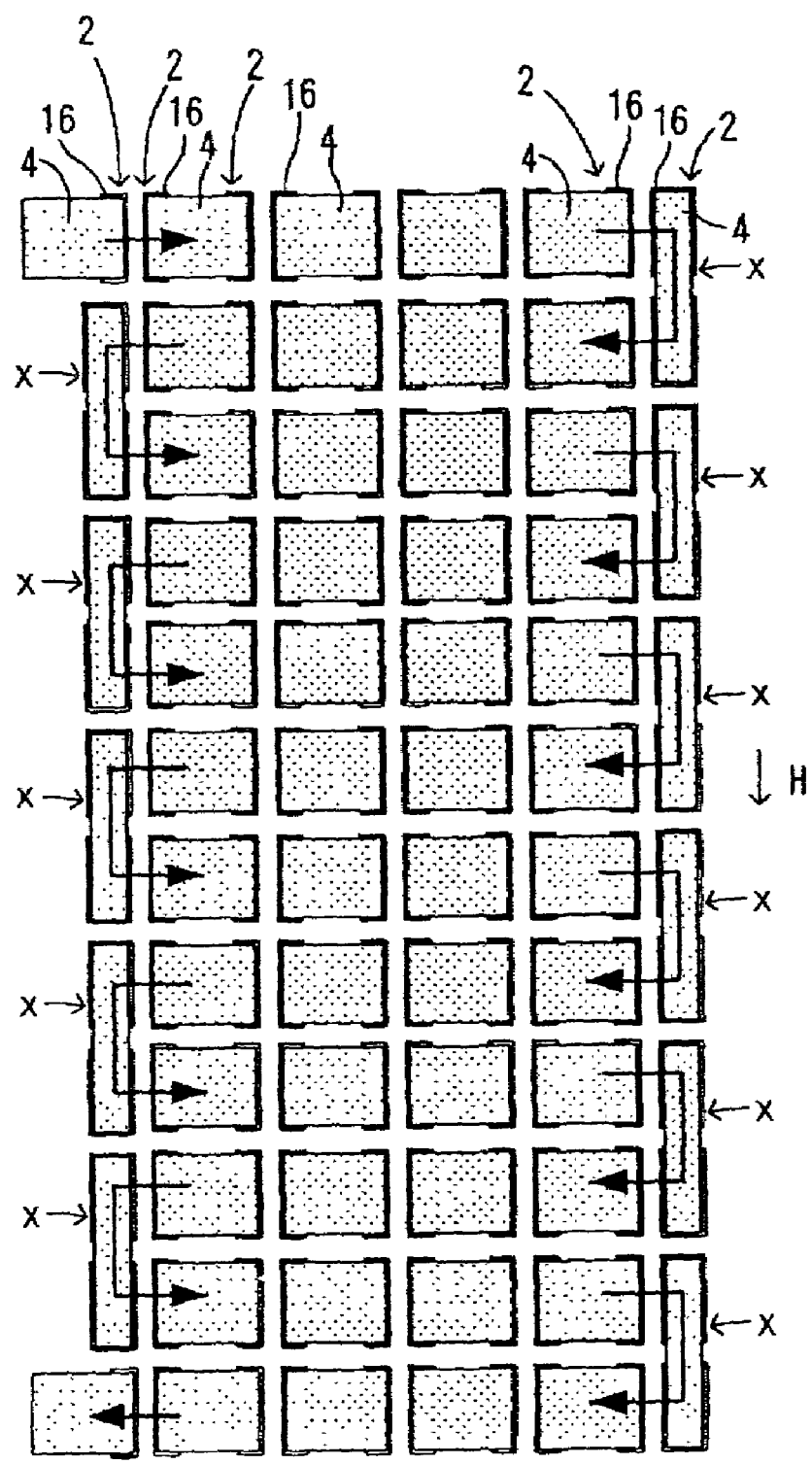
FIG. 22 is a schematic overhead view of a magnetic resistance device having a second matrix structure in which a plurality of magnetic resistance devices are arranged in the form of a matrix.

FIG. 21 shows an overhead view of a magnetic sensor employing this first matrix structure. This drawing shows a schematic overhead view of an example of arranging, for example, 20×4 magnetic tunnel resistance devices 2 in the form of a matrix on a rectangular substrate 5 (not shown). FIG. 22 shows an overhead view of a magnetic sensor employing a second matrix structure. This drawing shows a schematic overhead view of an example of arranging, for example, 10×12 magnetic tunnel resistance devices 2 in the form of a matrix on a rectangular substrate 5 (not shown).

In these cases as well, similar to the case of the previously described fourth connection example of FIGS. 10A and 10B, a pair of magnetic tunnel junction structures (magnetic tunnel resistance devices 2), formed to have a shape in the form of a rectangle when viewed in a plan view and comprised by laminating lower magnetic layer 9, barrier film 10, upper magnetic layer 11 and dummy film 16, are arranged on a common lower electrode 3 and antiferromagnetic film 8 so that their long sides are in the longitudinal direction, in parallel and opposing each other, and a plurality of lower electrodes 3 and antiferromagnetic films 8, on which are respectively arranged the above pairs of magnetic tunnel junction structures, are arranged linearly in the horizontal direction and in a plurality of rows in the longitudinal direction on substrate 5. With respect to those magnetic tunnel resistance devices 2 other than those magnetic tunnel resistance devices 2 on the left and right ends, each dummy film 16 (upper magnetic layer 11) of a pair of magnetic tunnel resistance devices 2 adjacent in the horizontal direction are linearly connected in series in the horizontal direction by upper electrode 4. With respect to magnetic tunnel resistance devices 2 on the left and right ends (indicated with an X), each dummy film 16 (upper magnetic layer 11) of the pair of magnetic resistance devices 1 shown above and below in the drawing are respectively connected by longitudinally long upper electrode 4. Furthermore, antiferromagnetic film 8 is omitted in FIGS. 21 and 22.

Together with making the directions of the long sides of upper magnetic layer 11 (magnetic tunnel resistance device 2) mutually opposed, in the magnetic sensor employing the first and second matrix structures composed in this manner, these magnetic tunnel resistance devices 2 are alternately coupled in a direction that is perpendicular to the above direction of the long sides with lower electrode 3 and upper electrode 4. Since current is made to flow in this same perpendicular direction, a large magnetic resistance change rate can be obtained as in the above-mentioned fourth through sixth connection examples. Furthermore, with respect to the magnetic tunnel resistance devices 2 (indicated with an X) on the left and right ends, the current flows through lower electrode 3 and upper electrode 4 while turning around as indicated by the arrows in the drawings.

In addition, the magnetic sensor employing the first matrix structure (FIG. 21) is composed such that the overall dimensions are short in the direction of the long sides of upper magnetic layer 11 (magnetic tunnel resistance device 2) and long in the direction of the short sides that intersects perpendicularly with the above direction of said long sides. In contrast, the magnetic sensor employing the second matrix structure (FIG. 22) is composed such that the overall dimensions are long in the direction of the long sides of upper magnetic layer 11 (magnetic tunnel resistance device 2) and short in the direction of the short sides that intersects perpendicularly with the above direction of said long sides. Namely, the direction of the long sides of upper magnetic layer 11 (magnetic tunnel resistance device 2) is consistent with the direction of the long sides of the entire sensor. In this type of magnetic sensor, the direction of magnetic field H is used as the direction of the long sides of upper magnetic layer 11 (magnetic tunnel resistance device 2) as shown in FIGS. 21 and 22, and in the case of FIG. 21, the width that intersects perpendicularly with the direction of magnetic field H is longer than in the case of FIG. 22, thereby making characteristics slightly inferior due to demagnetizing field effects. Thus, together with making the direction parallel to the direction of magnetic field H the direction of the long sides of upper magnetic layer 11 (magnetic tunnel resistance device 2), it is preferable that the direction of the entire sensor be the direction of the long sides as in the magnetic sensor employing the second matrix structure (FIG. 22).

Figure 23:
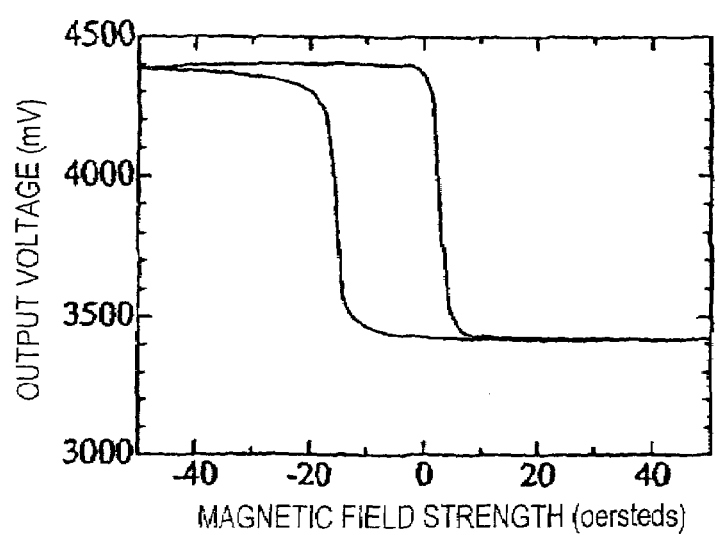
FIG. 23 is a characteristics graph of output voltage versus magnetic field of a magnetic resistance device having the above second matrix structure.

Next, measurement results are shown for a magnetic sensor employing the above second matrix structure. In this measurement, in addition to making the length of the short sides (length in the horizontal direction of FIG. 22) of upper magnetic layer 11 (barrier film 10 and lower magnetic layer 9) 10 $\mu$m, the length of the long sides (length in the longitudinal direction of FIG. 22) was made to be 60 $\mu$m (aspect ratio: "6"), and together with making the length in the horizontal direction of antiferromagnetic film 8 and lower electrode 3 (not shown in the drawing) 32 $\mu$m, the length in the longitudinal direction was made to be 68 $\mu$m. Together with arranging 16 antiferromagnetic films 8 and lower electrodes 3 on which are loaded pairs of magnetic tunnel resistance devices 2 (or 32 magnetic tunnel resistance devices 2) at a pitch of 36 $\mu$m in the horizontal direction, 16 were arranged at a pitch of 72 $\mu$m in the longitudinal direction to compose a magnetic sensor with 512 magnetic tunnel resistance devices 2. In this case, the normalized resistance value is 66 k$\Omega \cdot \mu$m$^2$, the resistance per magnetic tunnel resistance device 2 is 110 $\Omega$, and the resistance of the magnetic sensor overall is 57 k$\Omega$. In addition, as a result of applying a current of 60 $\mu$A to this sensor to change the magnetic field, an output voltage as shown in FIG. 23 was obtained. As a result, according to this experiment, experimental data was obtained in which the resistance value was 57 k$\Omega$ and the resistance change rate was 29%.

If a magnetic sensor is composed by arranging magnetic tunnel resistance devices 2 in the form of a matrix in the above manner, even if a large number of magnetic tunnel resistance devices 2 are connected in series, a high magnetic resistance change rate can be obtained without having to compose the magnetic sensor itself to have a long, narrow shape. In particular, if the direction of the long sides of upper magnetic layer 11 (magnetic tunnel resistance device 2) is made to coincide with the direction of the long sides of the entire sensor, a magnetic sensor can be realized having high magnetic resistance change rate overall.

Furthermore, although the above descriptions have indicated examples of arranging a pair of magnetic tunnel junction structures (magnetic tunnel resistance devices 2), comprised by laminating lower magnetic layer 9, barrier film 10, upper magnetic layer 11 and dummy film 16, on a common lower electrode 3 and antiferromagnetic film 8, results similar to those described above are also obtained in the case of arranging a pair of magnetic tunnel resistance devices 2, comprised by laminating antiferromagnetic film 8, lower magnetic layer 9, barrier film 10, upper magnetic layer 11 and dummy film 16, on a common lower electrode 3.

Although the invention has been described in detail herein with reference to its preferred embodiments and certain described alternatives, it is to be understood that this description is by way of example only, and it is not to be construed in a limiting sense. It is further understood that numerous changes in the details of the embodiments of the invention, and additional embodiments of the invention, will be apparent to, and may be made by, persons of ordinary skill in the art having reference to this description. It is contemplated that all such changes and additional embodiments are within the spirit and true scope of the invention as claimed.

What is claimed is:

1. A magnetic resistance device comprising:
   at least two a pairs of physically separated magnetic tunnel junction structures supported on a single flat surface of a substrate;
   each of said magnetic tunnel junction structures including a barrier film sandwiched between a lower magnetic layer and an upper magnetic layer, and an upper electrode electrically connected to the upper magnetic layer;
   wherein one upper magnetic layers in one of the pairs of magnetic tunnel junction structures is electrically connected to one upper magnetic layers in one of the other pairs of magnetic tunnel junction structures via their respective upper electrodes and electrically connected to another magnetic layer which is included in either one of another pair of magnetic tunnel junction structures.

2. A magnetic resistance device according to claim 1 wherein, stationary magnetizing layers for using each of said lower magnetic layers and stationary layers are respectively and independently provided separately between each conductive layer and each lower magnetic layer of said pair of magnetic tunnel junction structures.

3. A magnetic resistance device according to claim 1 wherein, stationary magnetizing layers for using each of said upper magnetic layers as stationary layers are respectively and independently provided separately between each of said upper magnetic layers and each of said independent upper electrodes of said pair of magnetic tunnel junction structures.

4. A magnetic resistance device according to claim 1 wherein, said pair of magnetic tunnel junction structures is formed by ion beam etching on said conductive layer.

5. A magnetic resistance device according to claim 1 further comprising a conductive layer provided on said substrate and under both magnetic tunnel junction structures.

6. A magnetic resistance device comprising:
   a pair of physically separated magnetic tunnel junction structures supported on a single flat surface of a substrate;

each of said magnetic tunnel junction structures including a barrier film sandwiched between a lower magnetic layer and an upper magnetic layer, an upper electrode electrically connected to the upper magnetic layer, and a stationary magnetizing layer provided between said substrate and each of said lower magnetic layer of said pair of magnetic tunnel junction structures, so as to said lower magnetic layers function as stationary layers.

7. A magnetic resistance device comprising:

a pair of physically separated magnetic tunnel junction structures supported on a single flat surface of a substrate;

each of said magnetic tunnel junction structures including a barrier film sandwiched between a lower magnetic layer and an upper magnetic layer, and an upper electrode electrically connected to the upper magnetic layer, a single continuous conductive layer provided on said substrate; and a single and continuous stationary magnetizing layer provided on said conductive layer and under said pair of magnetic tunnel junction structures, wherein said stationary magnetizing layer make said lower magnetic layers of said pair of magnetic tunnel junction structures function as stationary layers.

8. A magnetic resistance device comprising:

a first and a second physically separated magnetic tunnel junction structures supported on a single flat surface of a substrate;

each of said magnetic tunnel junction structures including a barrier film sandwiched between a lower magnetic layer and an upper magnetic layer, and an upper electrode electrically connected to the upper magnetic layer;

wherein the upper magnetic layer in a first magnetic tunnel junction structures is electrically connected to the upper magnetic layer in a second magnetic tunnel junction structure via the upper electrode in the first and second magnetic tunnel junction structures.

* * * * *